United States Patent
Salehi et al.

(10) Patent No.: US 10,624,214 B2
(45) Date of Patent: Apr. 14, 2020

(54) LOW-PROFILE SPACE-EFFICIENT SHIELDING FOR SIP MODULE

(71) Applicant: APPLE INC., Cupertino, CA (US)

(72) Inventors: Amir Salehi, Cupertino, CA (US); Takayoshi Katahira, Cupertino, CA (US); Vu T. Vo, Cupertino, CA (US); Wyeman Chen, Cupertino, CA (US); Chang Liu, San Jose, CA (US); Dennis R. Pyper, Cupertino, CA (US); Steven Patrick Cardinali, Cupertino, CA (US); Lan Hoang, Cupertino, CA (US); Siddharth Nangia, Cupertino, CA (US); Meng Chi Lee, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 550 days.

(21) Appl. No.: 15/041,033

(22) Filed: Feb. 11, 2016

(65) Prior Publication Data

US 2016/0270213 A1    Sep. 15, 2016

Related U.S. Application Data

(60) Provisional application No. 62/115,096, filed on Feb. 11, 2015, provisional application No. 62/138,951, (Continued)

(51) Int. Cl.
*H05K 1/02* (2006.01)
*H05K 3/28* (2006.01)
*B33Y 80/00* (2015.01)

(52) U.S. Cl.
CPC .............. *H05K 3/284* (2013.01); *B33Y 80/00* (2014.12); *H05K 1/0224* (2013.01);
(Continued)

(58) Field of Classification Search
CPC .. H05K 9/0032; H05K 9/0039; H01L 23/142; H01L 23/467; H01L 23/427; H01L 23/473; H01L 23/4093; G06F 1/20
(Continued)

(56) References Cited

U.S. PATENT DOCUMENTS 4,768,286 A * 9/1988 Ketcham ................ H05K 3/284
                                              29/841
5,054,193 A * 10/1991 Ohms .................. H05K 3/3415
                                              269/21

(Continued)

FOREIGN PATENT DOCUMENTS

CN    101803017    8/2010
CN    102487059    6/2012
(Continued)

OTHER PUBLICATIONS

U.S. Appl. No. 14/296,449, Non-Final Office Action, dated Jun. 24, 2016, 13 pages.
(Continued)

*Primary Examiner* — Tuan T Dinh
(74) *Attorney, Agent, or Firm* — Kilpatrick Townsend & Stockton, LLP

(57) ABSTRACT

Readily manufactured structures for sealing or encapsulating devices in system-in-a-package modules, such that the modules are easily assembled, have a low-profile, and are space efficient. One example may provide readily manufactured covers for SIP modules. These modules may be easily assembled by attaching the cover to a top side of a substrate. These SIP modules may have a low-profile, for example when their height is reduced using one or more recesses in a bottom surface of a top of the recess, where the one or more recesses are arranged to accept one or more components. These SIP modules may be made space efficient by placing an edge of a cover near an edge of the substrate and
(Continued)

connecting the plating of the cover using side plating on, or vias through, the substrate.

20 Claims, 29 Drawing Sheets

Related U.S. Application Data filed on Mar. 26, 2015, provisional application No. 62/166,006, filed on May 24, 2015.

(52) U.S. Cl.
CPC ............... *H05K 2201/0141* (2013.01); *H05K 2201/0715* (2013.01); *H05K 2201/10242* (2013.01); *H05K 2201/10318* (2013.01); *H05K 2201/10969* (2013.01); *H05K 2201/2036* (2013.01)

(58) Field of Classification Search
USPC ........ 361/688–710, 760–764, 767, 803, 816, 361/818; 257/686, 700–705
See application file for complete search history.

(56) References Cited

U.S. PATENT DOCUMENTS

| | | | | |
|---|---|---|---|---|
| 5,296,739 | A * | 3/1994 | Heilbronner | H01L 23/4006 165/80.2 |
| 6,335,492 | B1 * | 1/2002 | Terasaka | H01L 23/49811 174/261 |
| 6,686,649 | B1 * | 2/2004 | Mathews | H01L 23/552 257/659 |
| 6,818,821 | B2 * | 11/2004 | Fujieda | B82Y 10/00 174/394 |
| 6,881,896 | B2 * | 4/2005 | Ebihara | H01L 23/552 174/546 |
| 7,310,233 | B2 * | 12/2007 | Bell | H05K 7/20509 165/185 |
| 7,881,068 | B2 * | 2/2011 | Vatanparast | H04M 1/0283 361/736 |
| 8,008,753 | B1 * | 8/2011 | Bolognia | H01L 23/552 257/659 |
| 8,061,012 | B2 | 11/2011 | Carey et al. | |
| 8,125,788 | B2 * | 2/2012 | Hatanaka | H03H 9/1021 257/659 |
| 8,226,874 | B2 * | 7/2012 | Huffstutler | H05K 3/284 264/272.11 |
| 8,294,252 | B1 | 10/2012 | Patel | |
| 8,319,335 | B2 * | 11/2012 | Bayerer | H01L 23/49562 257/717 |
| 8,872,319 | B2 | 10/2014 | Kim et al. | |
| 8,895,360 | B2 | 11/2014 | Chang et al. | |
| 9,007,273 | B2 * | 4/2015 | Liao | H01L 23/481 343/841 |
| 2002/0027010 | A1 * | 3/2002 | Glenn | H01L 21/56 174/524 |
| 2003/0165051 | A1 | 9/2003 | Kledzik et al. | |
| 2004/0217465 | A1 * | 11/2004 | Stolze | H01L 23/16 257/706 |
| 2006/0115928 | A1 | 6/2006 | Nguyen et al. | |
| 2006/0163707 | A1 | 7/2006 | Hooi | |
| 2006/0272857 | A1 * | 12/2006 | Arnold | H05K 9/0024 174/377 |
| 2009/0000114 | A1 | 1/2009 | Rao | |
| 2010/0140759 | A1 | 6/2010 | Pagaila | |
| 2011/0228506 | A1 * | 9/2011 | Chen | H01L 22/32 361/810 |
| 2011/0286194 | A1 | 11/2011 | Kawabata et al. | |
| 2012/0061814 | A1 | 3/2012 | Camacho et al. | |
| 2012/0217624 | A1 | 8/2012 | Morris et al. | |
| 2013/0015564 | A1 * | 1/2013 | Matsuki | H01L 21/561 257/660 |
| 2013/0223038 | A1 | 8/2013 | Yamamoto et al. | |
| 2013/0241044 | A1 | 9/2013 | Kim | |
| 2013/0343023 | A1 | 12/2013 | Nakagoshi et al. | |
| 2014/0103527 | A1 | 4/2014 | Marimuthu et al. | |
| 2014/0167232 | A1 | 6/2014 | LoBianco | |
| 2014/0203457 | A1 | 7/2014 | Kim et al. | |
| 2014/0293550 | A1 * | 10/2014 | Mugiya | H05K 1/0218 361/728 |
| 2015/0187742 | A1 | 7/2015 | Kwon et al. | |
| 2015/0200182 | A1 | 7/2015 | Wang et al. | |
| 2015/0200185 | A1 | 7/2015 | Yu et al. | |
| 2015/0206854 | A1 | 7/2015 | Lane et al. | |
| 2015/0348865 | A1 | 12/2015 | Vincent | |
| 2015/0359099 | A1 | 12/2015 | Pennathur et al. | |
| 2016/0021756 | A1 | 1/2016 | Lee et al. | |

FOREIGN PATENT DOCUMENTS

| | | |
|---|---|---|
| CN | 103517577 | 1/2014 |
| CN | 103579114 | 2/2014 |
| JP | 2011514015 | 4/2011 |
| KR | 1020090022749 | 3/2009 |
| WO | 2013095402 | 6/2013 |
| WO | 2013176426 | 11/2013 |
| WO | 2015187972 | 12/2015 |

OTHER PUBLICATIONS

Office Action dated Jan. 25, 2017 in U.S. Appl. No. 14/296,449, 15 pages.
Office Action dated Mar. 2, 2017 in U.S. Appl. No. 14/730,250, 12 pages.
U.S. Appl. No. 14/296,449 , "Advisory Action", dated May 18, 2016, 4 pages.
U.S. Appl. No. 14/296,449 , "Final Office Action", dated Feb. 4, 2016, 18 pages.
U.S. Appl. No. 14/296,449 , "Non-Final Office Action", dated Aug. 14, 2015, 13 pages.
U.S. Appl. No. 14/730,250 , "Requirement for Restriction/Election", dated May 4, 2016, 8 pages.
Chinese Patent Application No. 201520379217.8 , "Notice of Decision to Grant", dated Nov. 19, 2015, 2 pages.
Chinese Patent Application No. 201520379217.8 , "Office Action", dated Aug. 7, 2015, 4 pages.
Korean Patent Application No. 10-2016-0037062 , "Office Action", dated May 10, 2016, 13 pages.
International Patent Application No. PCT/US2015/034233 , "International Search Report and Written Opinion", dated Sep. 15, 2015, 13 pages.
International Patent Application No. PCT/US2016/024110 , "Invitation to Pay Additional Fees and Partial Search Report", dated Jun. 29, 2016, 6 pages.
Taiwan Patent Application No. 104208922 , "Office Action", dated Jan. 15, 2016, 3 pages.
Taiwan Patent Application No. 105203852 , "Office Action", dated May 12, 2016, 2 pages.
Office Action dated Sep. 8, 2016 in U.S. Appl. No. 14/730,250, 18 pages.
International Search Report and Written Opinion dated Oct. 5, 2016 in PCT/US2016/024110, 17 pages.
Chinese Patent Application No. 201690000270.5 , "Utility Model Patent Evaluation Report", English Translation, Dec. 20, 2018, 10 pages.
Office Action dated Apr. 30, 2018 in U.S. Appl. No. 15/080,523, 13 pages.

* cited by examiner

LOW-PROFILE SPACE-EFFICIENT SHIELDING FOR SIP MODULE

CROSS REFERENCE TO RELATED APPLICATIONS

The present application claims the benefit of U.S. provisional application Nos. 62/115,096, filed Feb. 11, 2015, 62/138,951, filed Mar. 26, 2015, and 62/166,006, filed May 24, 2015, which are hereby incorporated by reference.

BACKGROUND

The number of types of electronic devices that are commercially available has increased tremendously the past few years and the rate of introduction of new devices shows no signs of abating. Devices, such as tablet, laptop, netbook, desktop, and all-in-one computers, cell, smart, and media phones, wearable computing devices, storage devices, portable media players, navigation systems, monitors, and others, have become ubiquitous.

The functionality of these devices has likewise greatly increased. This in turn has led to increased complexity inside of these electronic devices. At the same time, the dimensions of these devices have become smaller. For example, smaller and thinner devices are becoming more popular.

This increasing functionality and decreasing size have necessitated the use of space-efficient circuit techniques. As one example, system-in-a-package modules and other similar structures may be used to increase an electronic device's functionality while reducing space consumed in the device.

These system-in-a-package modules may be sealed and encapsulated in a plastic or other material. But there may be spacing limitations on how close an encapsulation may be to an edge of a printed circuit board. There may also be limitations on how close a device can be to an edge of the encapsulation. For these reasons, the encapsulation may consume a large amount of space on a printed circuit board. Also, the encapsulation may have a significant height in order to ensure coverage is provided for the various devices in the module.

Conventional encapsulation may require several manufacturing steps. Also, several of these steps may require high temperatures that may reduce reliability and yield.

Thus, what is needed are readily manufactured structures for sealing or encapsulating devices in system-in-a-package modules, such that the modules are easily assembled, have a low-profile, and are space efficient.

SUMMARY

Accordingly, embodiments of the present invention may provide readily manufactured structures for sealing or encapsulating devices in system-in-a-package modules, such that the modules are easily assembled, have a low-profile, and are space efficient.

An illustrative embodiment of the present invention may provide a SIP module having a cover over at least a portion of a printed circuit board or other appropriate substrate. The cover may be formed of a top horizontal portion supported by a vertical outside rim or sidewall. The cover may be formed of a non-conductive material, such as plastic, liquid-crystal polymer (LCP), nylon, silicone, or other nonconductive material or combination of materials. The cover may have a plated outside surface for electromagnetic (EMI) shielding. The plating may be aluminum, copper, or other material or combination of materials. The plating may also cover a bottom surface of the outside rim, where it may contact one or more pads on a printed circuit board or other substrate. In these and other embodiments, instead of being described as a top horizontal portion supported by a vertical outside rim, the cover may be described as a forming a cavity over the top side of at least the portion of the printed circuit board or other appropriate substrate, the cavity defined by a sidewall and a bottom of a top portion of the cover.

Another illustrative embodiment of the present invention may provide a SIP module having a cover that includes one or more metallic posts or walls (which may be generally referred to as a stand-off) These posts or walls may extend from a top plating over the cover to a pad on a printed circuit board or other substrate on which the SIP module is formed. The posts or walls may be formed of aluminum, steel, copper, or other conductive material. In still other embodiments of the present invention, these posts or walls may be formed of a conductive adhesive. These conductive adhesive posts of walls may be formed using printing, stenciling, or other appropriate technique. Such a cover may be manufactured by forming one or more metallic posts or walls. The posts or walls may be considered to be oriented in a vertical direction. A cover including a horizontal top and vertical sidewalls may be formed around the one or more posts and walls. The cover may form a cavity defined by a sidewall and a bottom of a top portion of the cover. The cover may be plated. The underside of the vertical sidewalls or outside rim may be plated. The underside of the one or more posts or walls may be plated as well.

In these and other embodiments of the present invention, the cover may be attached over at least a portion of a printed circuit board or other appropriate substrate. One or more pads may be formed on a top surface of the printed circuit board or other appropriate substrate. The pads may connect to contacts or pads on a bottom surface of the printed circuit board or other substrate. The top pads and the bottom pads may be connected by plating on one or more sides of the printed circuit board or other substrate. In these and other embodiments of the present invention, the top pads and the bottom pads may be connected by vias extending from a top to a bottom of the printed circuit board or other substrate. One or more integrated circuits, sub-modules, components, or other electrical or mechanical components may be attached to one or more surfaces of the printed circuit board or other substrate. These components may be electrical or electromagnet components such as passive components, such as capacitors and resistors, or active components, such as diodes, transistors, or integrated circuits such as a chip-scale package or flip-chip, may be attached to a top surface of a molded substrate having a number of first conductive paths. These components may be electrically connected to each other through traces and vias on various layers of the printed circuit board or other substrate. Some or all of these components may be covered. These components may connect to other components in an electrical device through various conductors, such as those in a flexible circuit board, a second printed circuit board or other appropriate substrate, or other appropriate conductor or conductive structure.

In these and other embodiments of the present invention, plating on a bottom of the sidewall and one or more posts may be electrically and mechanically joined to the printed circuit board or other substrate in various ways. For example, plating on a bottom of the sidewall and one or more posts or walls may be joined to pads or contacts on a surface of a printed circuit board or other substrate using an anisotropic conductive film, an anisotropic conductive paste, a self-assembly anisotropic conductive paste, or other material or combination of materials. The use of one or more of these materials may provide a simple, low-temperature method of assembling the cover to a substrate that may prevent damage to, or the detachment of, other components on or associated with the SIP module. During assembly, the cover may be aligned to the printed circuit board or other appropriate substrate using fiducials or other alignment markings or technique.

In these and other embodiments of the present invention, the cover may form a cavity over the top side of at least the portion of a printed circuit board or other appropriate substrate, the cavity defined by a sidewall of the cover and a bottom side of a top portion of the cover. The bottom side of the top portion of the cover may include one or more recesses. The one or more recesses may be arranged to accept one or more electrical or mechanical components on a top surface of the printed circuit board or other appropriate substrate.

In still other embodiments of the present invention, instead of forming a cavity, a cover may include a bottom surface having one or more recesses, the recesses arranged to accept one or more electrical or mechanical components on a top surface of the printed circuit board or other appropriate substrate.

In these and other embodiments of the present invention, the cavity formed by the cover may be at least partially filled with an epoxy or other potting material. The use of this epoxy may improve water resistance and reliability of the SIP module to shocks from impacts or other stresses. In these and other embodiments of the present invention, the top of the cavity formed by the cover may include one or more recesses for one or more electronic devices on a top surface of the printed circuit board or other appropriate substrate, and the cavity may be at least partially filled with an epoxy or other potting material.

In this way, embodiments of the present invention may provide readily manufactured structures for sealing or encapsulating devices in system-in-a-package modules. Specifically, embodiments of the present invention may provide readily manufactured covers formed of plastic, LCP, or other non-conductive material, which may be plated after being formed. These modules may be easily assembled by attaching the cover to a top side of a printed circuit board or other appropriate substrate. This may stand in contrast to conventional SIP manufacturing techniques that may require several manufacturing steps at high temperatures. This reduction in manufacturing time and reduction in manufacturing temperatures may speed the manufacturing process, reduce costs, increase through-put, and increase yields. These SIP modules may also have a low-profile, for example when their height is reduced using one or more recesses in a bottom surface of a top of the cover, where the one or more recesses are arranged to accept one or more components on a top side of a printed circuit board or other substrate. These SIP modules may be made space efficient by placing an edge of a cover near an edge of the printed circuit board or other appropriate substrate and connecting the plating of the cover using side plating on, or vias through, the printed circuit board or other appropriate substrate.

In various embodiments of the present invention, a SIP module may be formed by attaching one or more electrical components to a top of a printed circuit board or other substrate, then covering the one or more electrical components with a plated cover. During the attachment of the cover, it may be undesirable to heat the printed circuit board or other appropriate substrate to a point where the one or more electrical components may become detached. The same concerns may arise when one or more other components are attached to a bottom surface of the printed circuit board or other appropriate substrate. Accordingly, embodiments of the present invention may use soldering materials that have different melting temperatures. For example, the solder or other material used to fix one or more electronic devices on a top side of a printed circuit board or other appropriate substrate may have a higher melting temperature than the solder or other material used to fix a cover to a top of the printed circuit board or other appropriate substrate. Similarly, the solder or other material used to fix one or more electronic devices on a top side of a printed circuit board or other appropriate substrate may have a higher melting temperature than the solder or other material used to fix one or more electronic devices to a bottom of the printed circuit board or other appropriate substrate. In a specific embodiment of the present invention, the higher melting point material may be a compound including tin, silver, and copper, while the lower melting point material may be a compound including a tin-antimony alloy or a tin-bismuth alloy.

In these embodiments of the present invention, components may be individually placed on a surface of a board, such as a printed circuit board. In these and other embodiments of the present invention, it may be more efficient to place more than one such component on a surface of a printed circuit board at a time. Accordingly, embodiments of the present invention may provide modules that may include multiple electrical or mechanical components. These modules may thus contain several components, but may be treated as a single component for assembly purposes. The allowed spacing between components in a module may be smaller than the allowed spacing if the components are handled individually. Thus, these modules may not only simplify assembly, but reduce the space consumed by the included components as well.

Embodiments of the present invention, including each of the embodiments shown here, may provide a module having a plurality of components. These components may be passive electrical or electromechanical components, such as capacitors and resistors, or they may be active components, such as diodes, transistors, or integrated circuits, or some combination thereof. These components may be encapsulated in a plastic, resin, or other type of molding. Contacts for the components may be available at a bottom side of the module. The module may be placed on a printed circuit board or other appropriate substrate. A shield may be placed or formed over the module. This shield may be a cap, as above, or it may be formed over a top and, in some embodiments, sides of the module by plating, sputtering, vapor deposition, or other appropriate technique. This shield may be grounded by using side plating or vias, as in the above examples.

An illustrative embodiment of the present invention may provide a method of forming a module. This method may include attaching a number of components to a top side of a carrier. The top side of the carrier may be covered with adhesive film to hold the components in place. The components may be encapsulated in a mold, after which the carrier and the film may be removed. The remaining module may then be attached to a printed circuit board or other appropriate substrate.

In one embodiment of the present invention, the film on the carrier may be relatively thick. The electrical or mechanical components may be pushed down into the film, such that the film is compressed between components and the carrier. Between components, the film may remain at or near an original thickness. Following plastic encapsulation, the film may be removed and an area of the contacts on electrical components may be exposed. This may facilitate attachment to contacts on a surface of a printed circuit board or other substrate.

In other embodiments of the present invention, contacts available at a bottom of a module may be spaced closer than corresponding contacts on a printed circuit board may be able to be formed or printed. Accordingly, embodiments of the present invention may employ techniques to either reduce the effective size of the contacts or to redistribute or reposition the contacts with sufficient spacing such that corresponding contacts may be formed on a printed circuit board.

In another illustrative embodiment of the present invention, a number of components may again be placed on a carrier. In this case, the adhesive film on a top surface of a carrier may be relatively thin. Following encapsulation and carrier and film removal, a bottom side of a resulting module may be relatively flat. A passivation layer may be placed on the bottom side the module. This passivation layer may be formed using a conformal coating or solder mask, polyamide, or other material. The passivation layer may have openings formed to allow access to contacts on the components. The openings in the passivation layer may be narrower in at least one direction than the width of the corresponding contact. This may increase the spacing between contacts on a surface of a printed circuit board, thereby enabling their printing and helping to prevent contacts form shorting to each other. In still other embodiments of the present invention, before the passivation layer is formed on the bottom side of the module, a metal or redistribution layer may be formed and patterned on the bottom side of the module. The metal or redistribution layer may be patterned to make the contacts of the components accessible at different locations on the module. The metal layer may also be patterned to provide a shield or shielding portions. These shielding portions may be connected to a top side shield by vias, side plating, or other technique. The passivation layer may then be added as before.

In another embodiment of the present invention, instead of attaching this module directly to a printed circuit board, the module may be attached through a redistribution layer. This redistribution layer may have contacts on a top and bottom side, where corresponding contacts on a top and bottom side are connected together through conductive traces. Contacts on a bottom side of the redistribution layer may be arranged to simplify the printing of corresponding contacts on a top surface of a printed circuit board. As before, this structure may be shielded, either by using a cap, or by a metallic layer formed by plating, sputtering, vapor deposition, or other technique. This shield may be grounded other along a side plating or vias, as before. This redistribution layer may be formed in various ways. For example, it may be formed on a top layer of a printed circuit board or other appropriate substrate. It may instead be formed as a layer on a bottom side of a module. In still other embodiments of the present invention it may be formed as a separate layer. The module and printed circuit board may then be attached.

In another embodiment of the present invention, one or more electrical or mechanical components may be individually shielded. An illustrative embodiment of the present invention may provide a device having one or more electrical components attached on a top side of a printed circuit board or other appropriate substrate. An adhesive layer may be formed over the components and at least a portion of a top surface of the printed circuit board. A shield may be formed over the components and the adhesive layer by plating, sputtering, vapor deposition, or other technique, for example by using a cap. This shield may be grounded using side plating or vias. In other embodiments of the present invention, these shields may be spot or laser welded to contacts on a top surface of a printed circuit board or other appropriate substrate.

It should be noted that while the interconnect structures described above are well-suited to forming system-in-a-package modules, in other embodiments of the present invention, other types of electronic devices may be formed using these techniques. Embodiments of the present invention may be used at different levels in the manufacturing of a SIP module. For example, a SIP module may be formed of one or more other sub-modules, and these embodiments of the present invention may be used in one or more of these sub-modules. The SIP module itself may be formed by employing one or more embodiments of the present invention.

In various embodiments of the present invention, contacts, interconnect paths, and other conductive portions of SIP modules may be formed by stamping, metal-injection molding, machining, micro-machining, 3-D printing, or other manufacturing process. The conductive portions may be formed of stainless steel, steel, copper, copper titanium, aluminum, phosphor bronze, or other material or combination of materials. They may be plated or coated with nickel, gold, or other material. The nonconductive portions may be formed using injection or other molding, 3-D printing, machining, or other manufacturing process. The nonconductive portions may be formed of silicon or silicone, rubber, hard rubber, plastic, nylon, liquid-crystal polymers, or other nonconductive material or combination of materials. The printed circuit board or other appropriate substrates used may be formed of FR-4, BT or other material. Printed circuit boards may be replaced by other substrates, such as flexible circuit boards, in many embodiments of the present invention, while flexible circuit boards may be replaced by printed circuit boards in these and other embodiments of the present invention.

Embodiments of the present invention may provide SIP modules that may be located in various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices.

Various embodiments of the present invention may incorporate one or more of these and the other features described herein. A better understanding of the nature and advantages of the present invention may be gained by reference to the following detailed description and the accompanying drawings.

DESCRIPTION OF EXEMPLARY EMBODIMENTS

Figure 1:
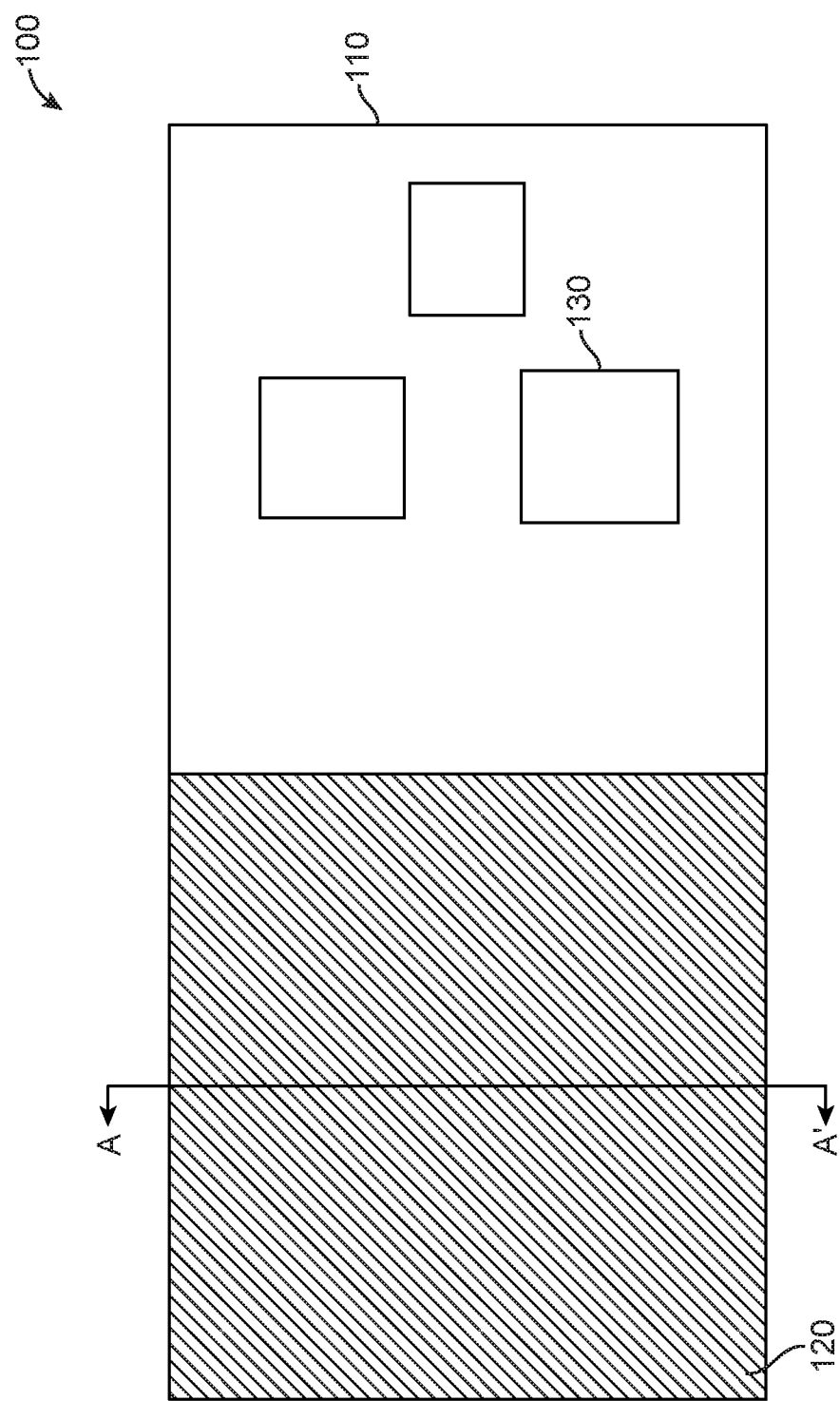
FIG. 1 illustrates a portion of an electronic device including a system-in-a-package module according to an embodiment of the present invention.

FIG. 1 illustrates a portion of an electronic device including a system-in-a-package module according to an embodiment of the present invention. This figure, as with the other included figures, is shown for illustrative purposes and does not limit either the possible embodiments of the present invention or the claims.

This figure includes a printed circuit board or other appropriate substrate 110 having a number of electronic circuits, sub-modules, components, or other electrical or mechanical devices on a top surface. A cover 120 may be placed over one or more other electrical or mechanical components (not shown.) The following figures illustrate cutaway views of embodiments of the present invention along line A-A' through cover 120.

In various embodiments of the present invention, a cover may be formed of a horizontal top portion supported by a vertical sidewall or outer rim. In these and other embodiments of the present invention, a cover may form a cavity over at least a portion of a printed circuit board or other appropriate substrate, the cavity defined by a sidewall and a bottom surface of a top portion of the cover. An example of a SIP module including such a cover is shown in the following figure.

Figure 2:
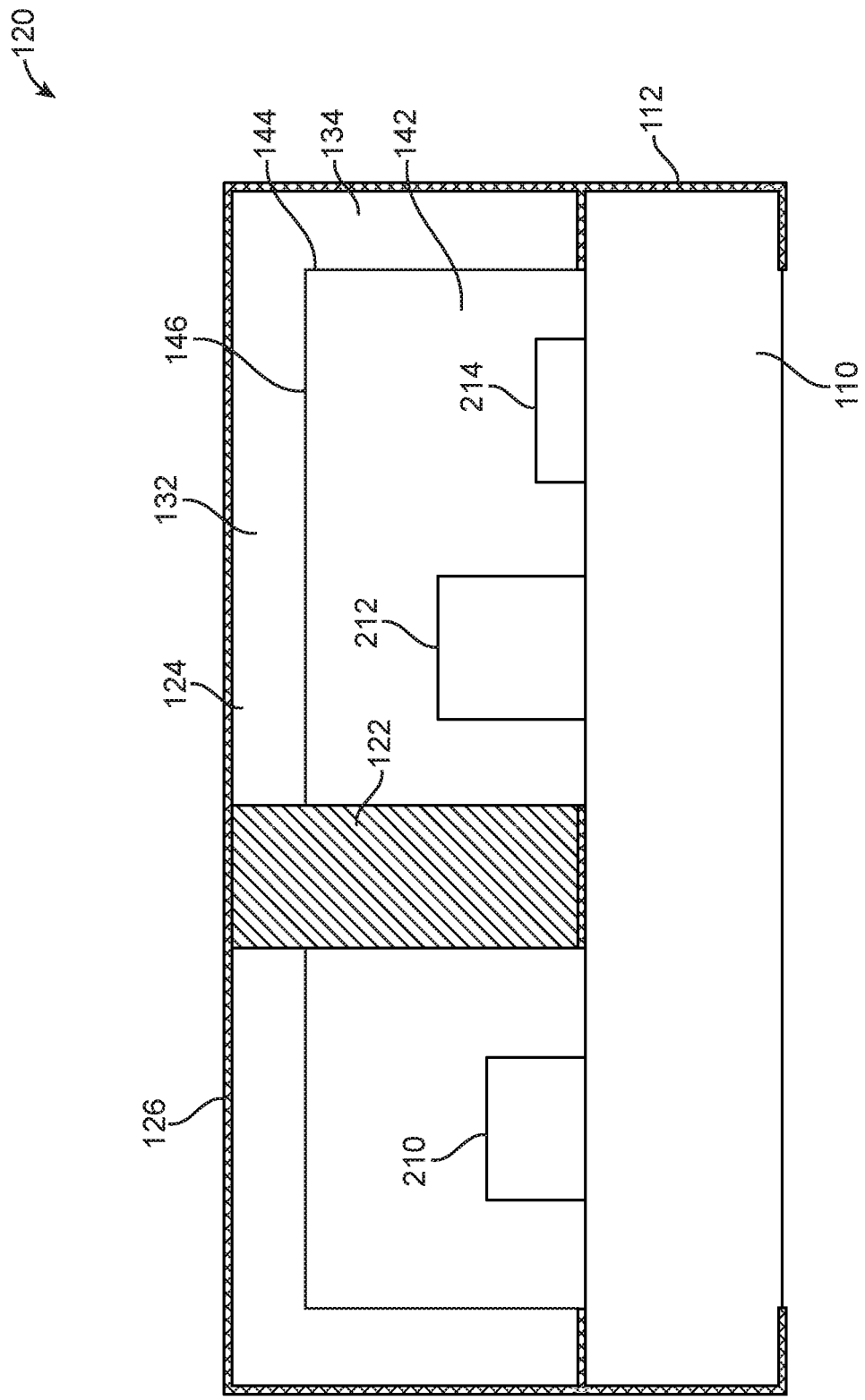
FIG. 2 illustrates a cutaway side view of a system-in-a-package module according to an embodiment of the present invention.

FIG. 2 illustrates a cutaway side view of a system-in-a-package module according to an embodiment of the present invention. In this example, a number of electrical or mechanical components 210, 212, and 214 may be placed on a top surface of printed circuit board or other appropriate substrate 110. Components 210, 212, and 214, as with the other components shown below and in other embodiments of the present invention, may be electrical or electromagnet components such as passive components, such as capacitors and resistors, or active components, such as diodes, transistors, or integrated circuits such as a chip-scale package or flip-chip, may be attached to a top surface of a molded substrate having a number of first conductive paths. The electrical or mechanical components 210, 212, and 214 may connect to each other through traces on one or more layers of printed circuit board or other appropriate substrate 110. The electrical or mechanical components 210, 212, and 214 may electrically connect to other circuits in an electronic device through flexible circuit boards, printed circuit board or other appropriate substrate, or other routing structures attached to a bottom of printed circuit board or other appropriate substrate 110 or other location.

A cover 120 may be placed over electrical mechanical components 210, 212, and 214. This cover may or reduce water ingress or leakage, thereby protecting the covered components. The cover may include a horizontal top portion 132 supported by vertical sidewalls 134. The cover may form one or more cavities 142 defined by an inside edge 144 of sidewall 134 and a bottom surface 146 of top portion 132.

Cover 120 may include a housing 124 made of plastic, LCP, or other nonconductive material. Cover 120 may be plated with metallic layer 126 for EMI shielding, mechanical support, or for other reasons. Plating 126 may be formed of aluminum, copper, gold, or other material or combinations of materials. Plating 126 may be electrically connected to plating 112 on printed circuit board or other appropriate substrate 110. Plating 112 may be formed as edge plating on printed circuit board or other appropriate substrate 110. Plating 126 on cover 120 may be electrically and mechanically attached to plating 112 on printed circuit board or other appropriate substrate 110 using an anisotropic conductive film, an anisotropic conductive paste, a self-assembly anisotropic conductive paste, or other material or combination of materials. The ability to align cover 120 to edges of printed circuit board or other appropriate substrate 110 may reduce the overall size of the SIP module.

In this example, cover 120 may include one or more metallic posts or walls 122. Metallic posts or walls 122 may form ground pathways for EMI shielding, mechanical support, or other reasons. Metallic posts or walls 122 may be formed of steel, aluminum, or other conductive material. An example of how a cover 120 may be formed is shown in the following figure.

Figure 3A:
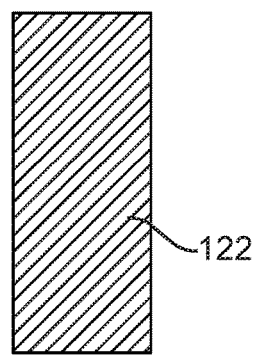
FIGS. 3A-3C illustrates steps in the manufacturing of a cover according to an embodiment of the present invention.
Figure 3B:
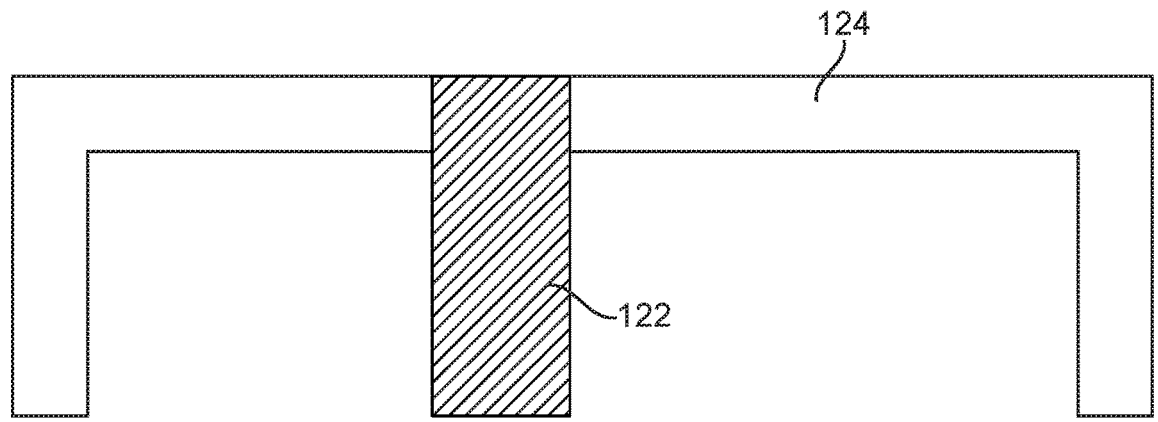
Figure 3C:
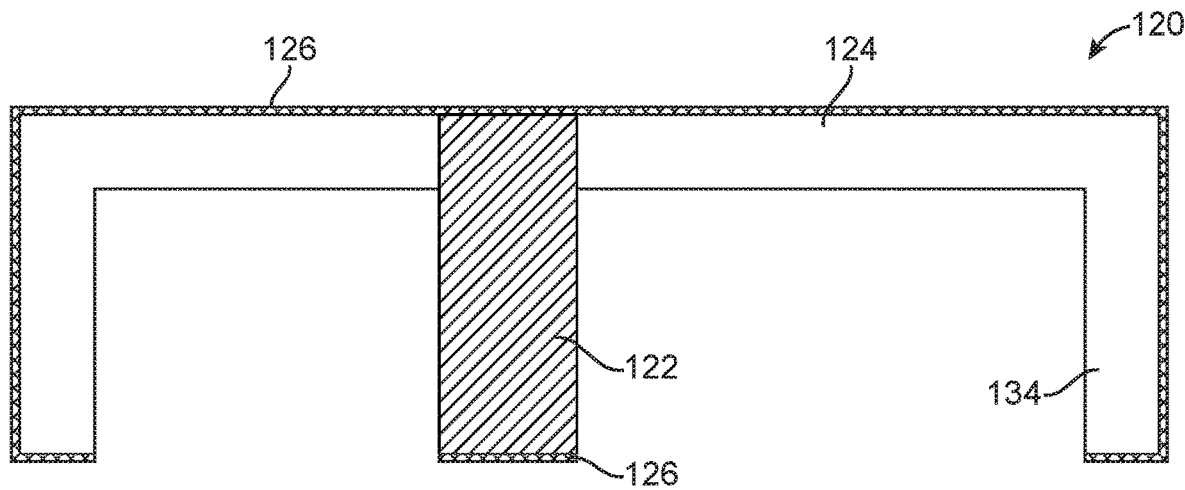

FIGS. 3A-3C illustrates steps in the manufacturing of a cover according to an embodiment of the present invention. In FIG. 3A, metallic or otherwise conductive post or wall (or more generally, stand-off) 122 may be formed. Metallic post or wall 122 may be formed by stamping, forging, metallic injection molding (MIM), machining, micro-machining, or other manufacturing technique. Posts or walls, such as post or wall 122 and the other posts or walls shown here may be formed of aluminum, steel, copper, or other conductive material. In still other embodiments of the present invention, these posts or walls 122 may be formed of a conductive adhesive. These conductive adhesive posts or walls 122 may be formed using printing, stenciling, or other appropriate technique. In various embodiments of the present invention, post or wall 122 may be a wall to isolate circuitry. For example, post 122 may be a wall or trench to isolate high-frequency radio network circuitry.

A housing 124 may be injection molded around the post 122 in FIG. 3B. In FIG. 3C, an outside surface of housing 124 may be plated. Bottom surfaces of sidewalls 134 and post 122 may similarly be plated. This plating may facilitate the attachment of cover 120 to a printed circuit board or other appropriate substrate.

Figure 4:
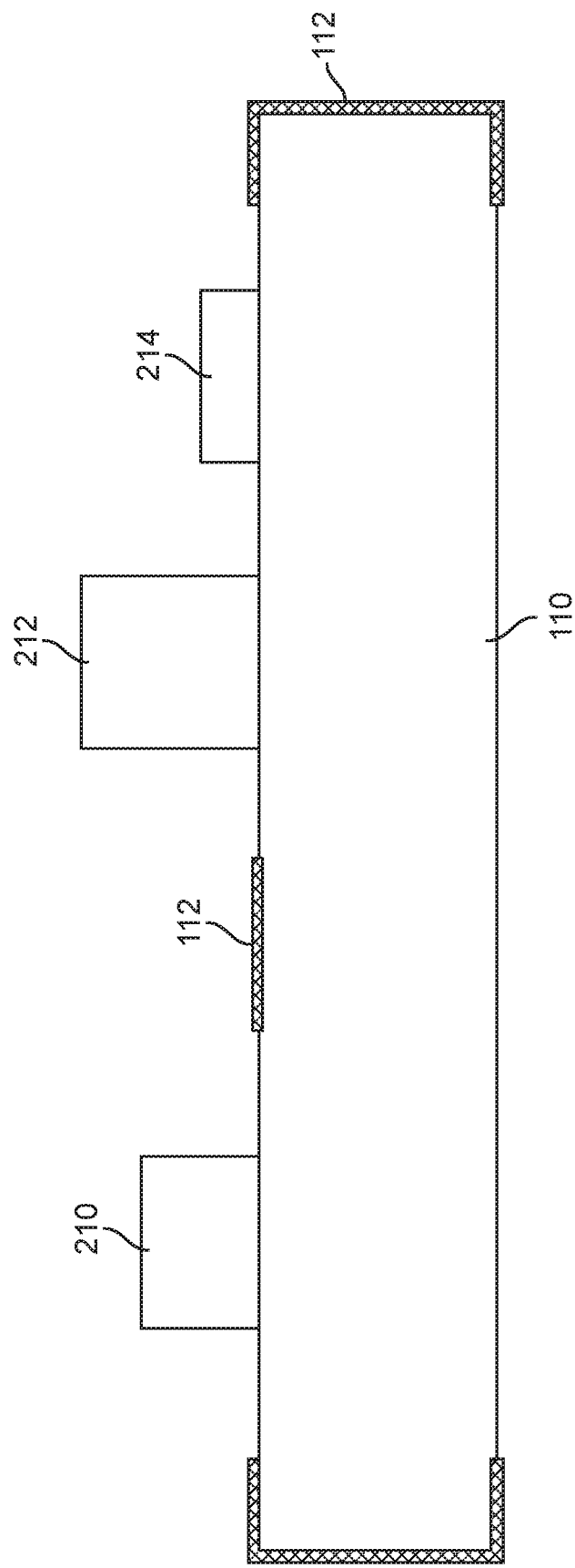
FIG. 4 illustrates a side view of at least a portion of a printed circuit board or other appropriate substrate according to an embodiment of the present invention.

FIG. 4 illustrates a side view of at least a portion of a printed circuit board or other appropriate substrate according to an embodiment of the present invention. In this example, a number of electrical or mechanical components 210, 212, and 214 have been attached to a top surface of printed circuit board or other appropriate substrate 110. Plated regions 112 have been formed. Plated regions 112 includes side plated regions to electrically connect pad areas on top and bottom sides of printed circuit board or other appropriate substrate 110. A region of plating 112 between electrical or mechanical components 210 and 212 may be formed to facilitate the attachments of a post of a cover (not shown.)

Figure 5:
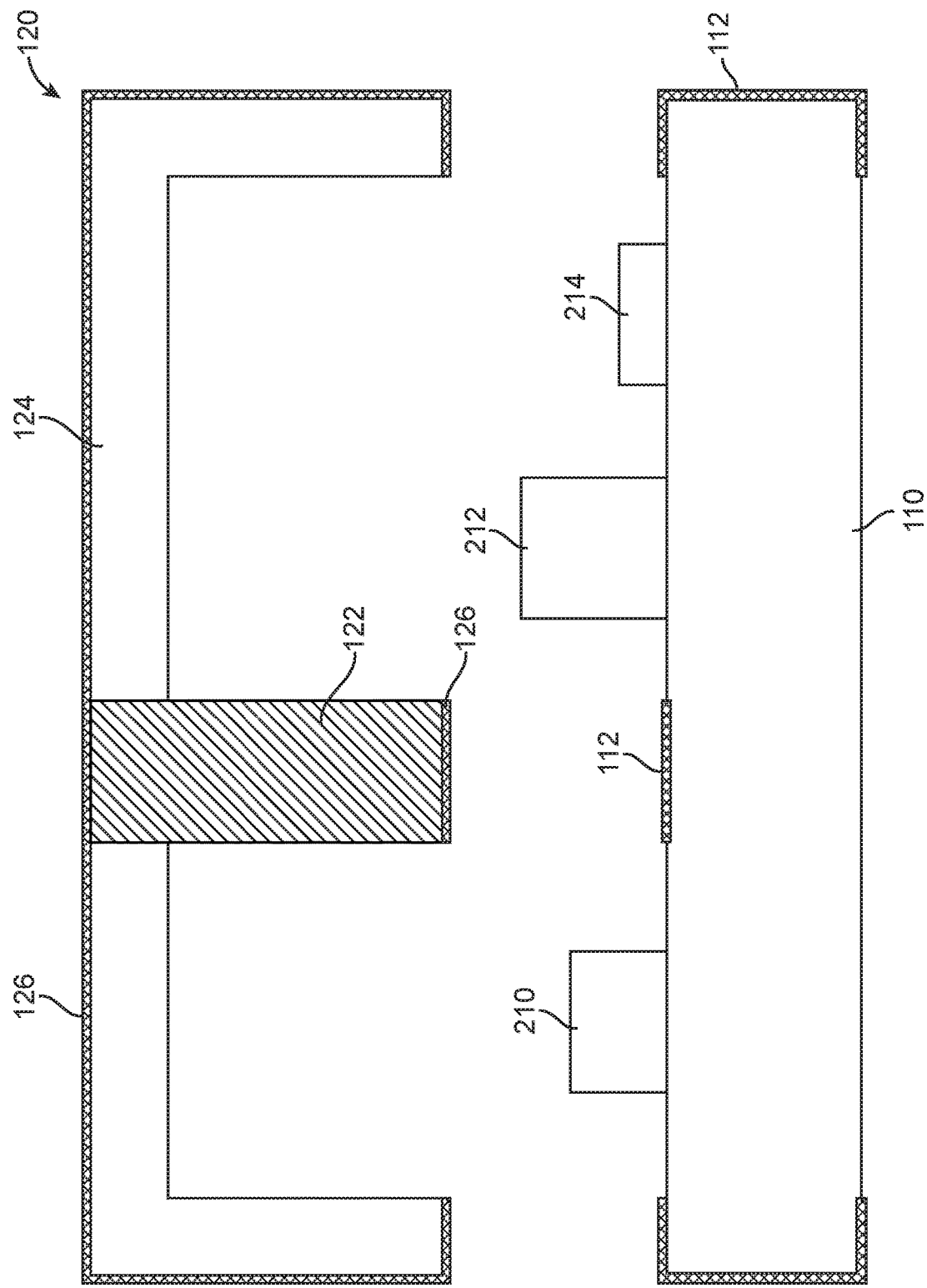
FIG. 5 illustrates a step in an assembly of a system-in-a-package module according to an embodiment of the present invention.

FIG. 5 illustrates a step in an assembly of a system-in-a-package module according to an embodiment of the present invention. In this figure, cover 120 is aligned and is about to be mated to printed circuit board or other appropriate substrate 110. Again, cover 120 may include plastic or LCP housing 124, which may be plated by layer 126. A metallic post 122 may further be included, though in these and other embodiments of the present invention, this post may be absent, or more than one post or other metallic structure may be included. Printed circuit board or other appropriate substrate 110 may include plated regions 112 and may support electrical or mechanical components 210, 212, and 214.

In various embodiments of the present invention, cover 120 may be aligned with printed circuit board or other appropriate substrate 110 using fiducials or other alignment marks or techniques. Cover 120 may be fixed to printed circuit board or other appropriate substrate 110 to provide the structure shown in FIG. 2 above.

In other embodiments of the present invention, connections on a printed circuit board or other appropriate substrate may be made in different ways. For example, instead of side platting, vias may be used to electrically connect pads or contacts on a top side of a printed circuit board or other appropriate substrate with pads or contacts on a bottom side of the printed circuit board or other appropriate substrate. An example is shown in the following figure.

Figure 6:
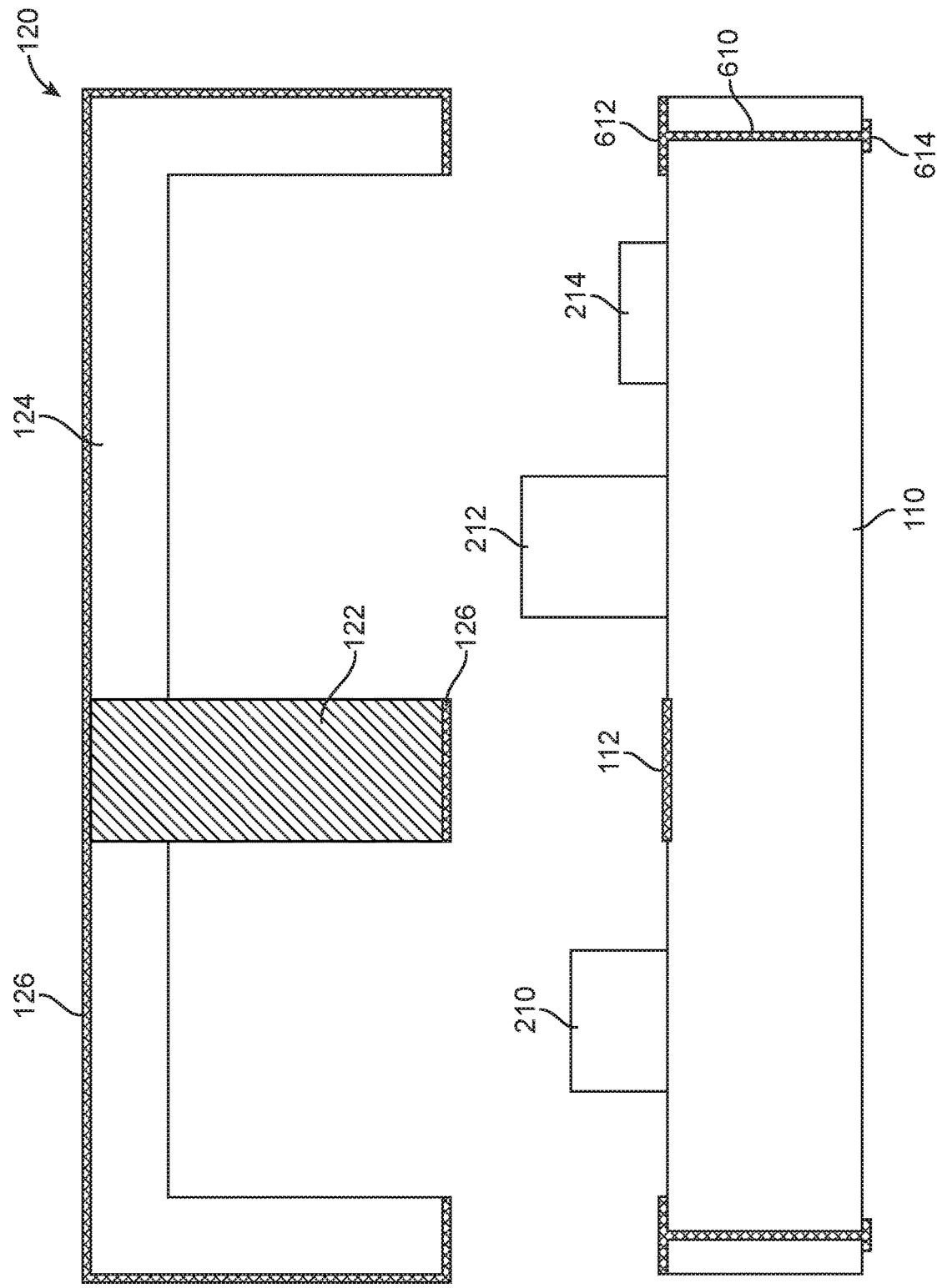
FIG. 6 illustrates a step in an assembly of a system-in-a-package module according to embodiments the present invention.

FIG. 6 illustrates a step in an assembly of a system-in-a-package module according to embodiments the present invention. In this figure, cover 120 is aligned and about to be mated with printed circuit board or other appropriate substrate 110. Printed board 110 may include pads or contacts 612 and 614 on its top and bottom surfaces. One or more vias 610 may electrically connect these pads or contacts. As before, cover 120 may include housing 124, which may be plated with layer 126. One or more metallic or otherwise conductive posts or walls 122 may be included as part of cover 120. Printed circuit board or other appropriate substrate 110 may further include plated regions 112 and electrical or mechanical devices 210, 212, and 214. Plated surfaces of cover 120 may be electrically and mechanically joined with contacts 610 and plated regions 112 using an anisotropic conductive film, an anisotropic conductive paste, a self-assembly anisotropic conductive paste, or other material or combination of materials.

Figure 7:
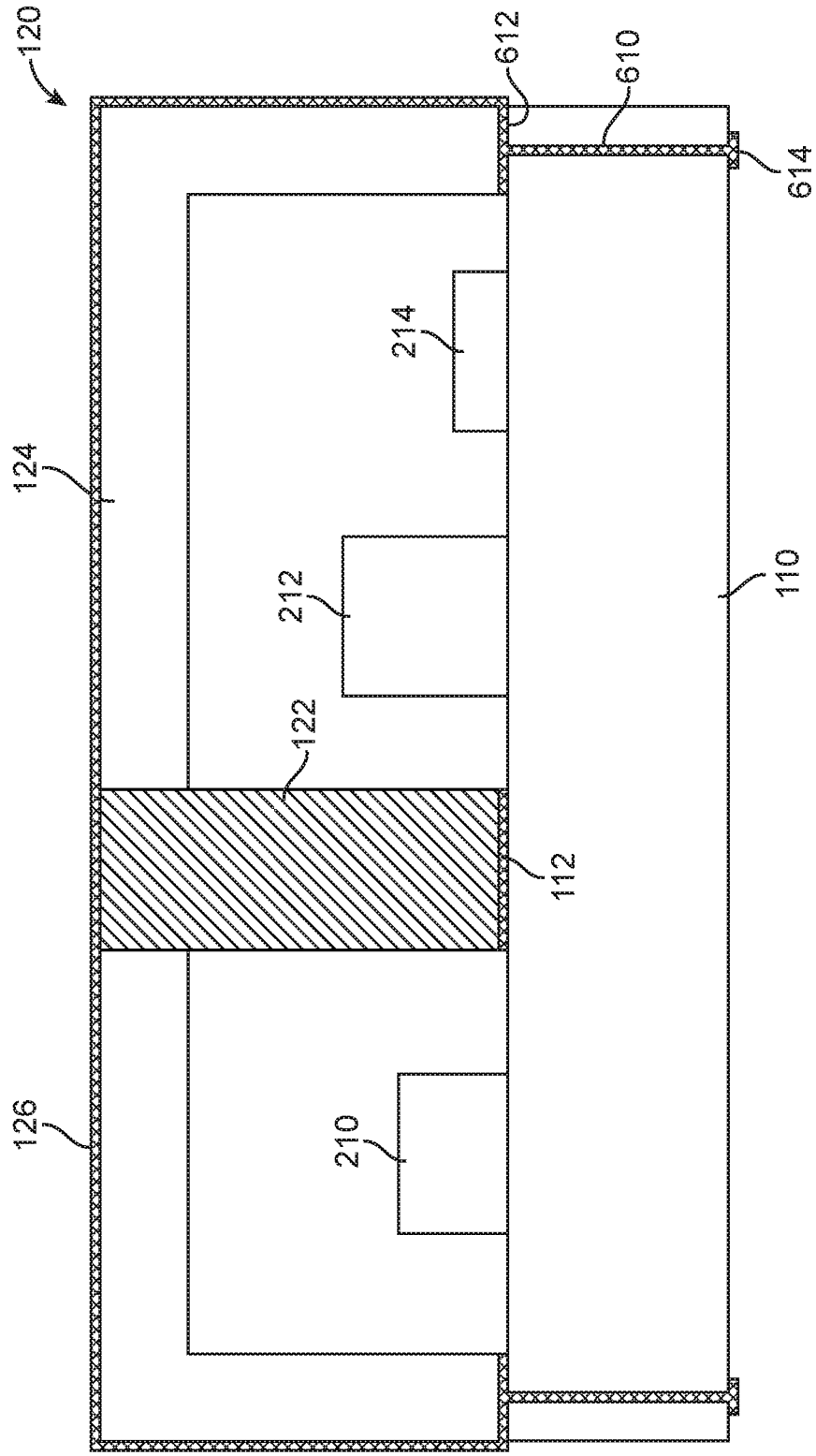
FIG. 7 illustrates a side view of a portion of a system-in-a-package module according to an embodiment of the present invention.

FIG. 7 illustrates a side view of a portion of a system-in-a-package module according to an embodiment of the present invention. In this example, cover 120 has been attached to printed circuit board or other appropriate substrate 110.

In various embodiments of the present invention, a profile or height of a system-in-a-package module may be reduced by forming one or more recesses in a bottom surface of a horizontal top portion of a cover. One or more electrical or mechanical components on a top surface of a printed circuit board or other appropriate substrate may then be fit into these one or more recesses, thereby reducing a combined height of the system-in-a-package module. An example is shown in the following figure.

Figure 8:
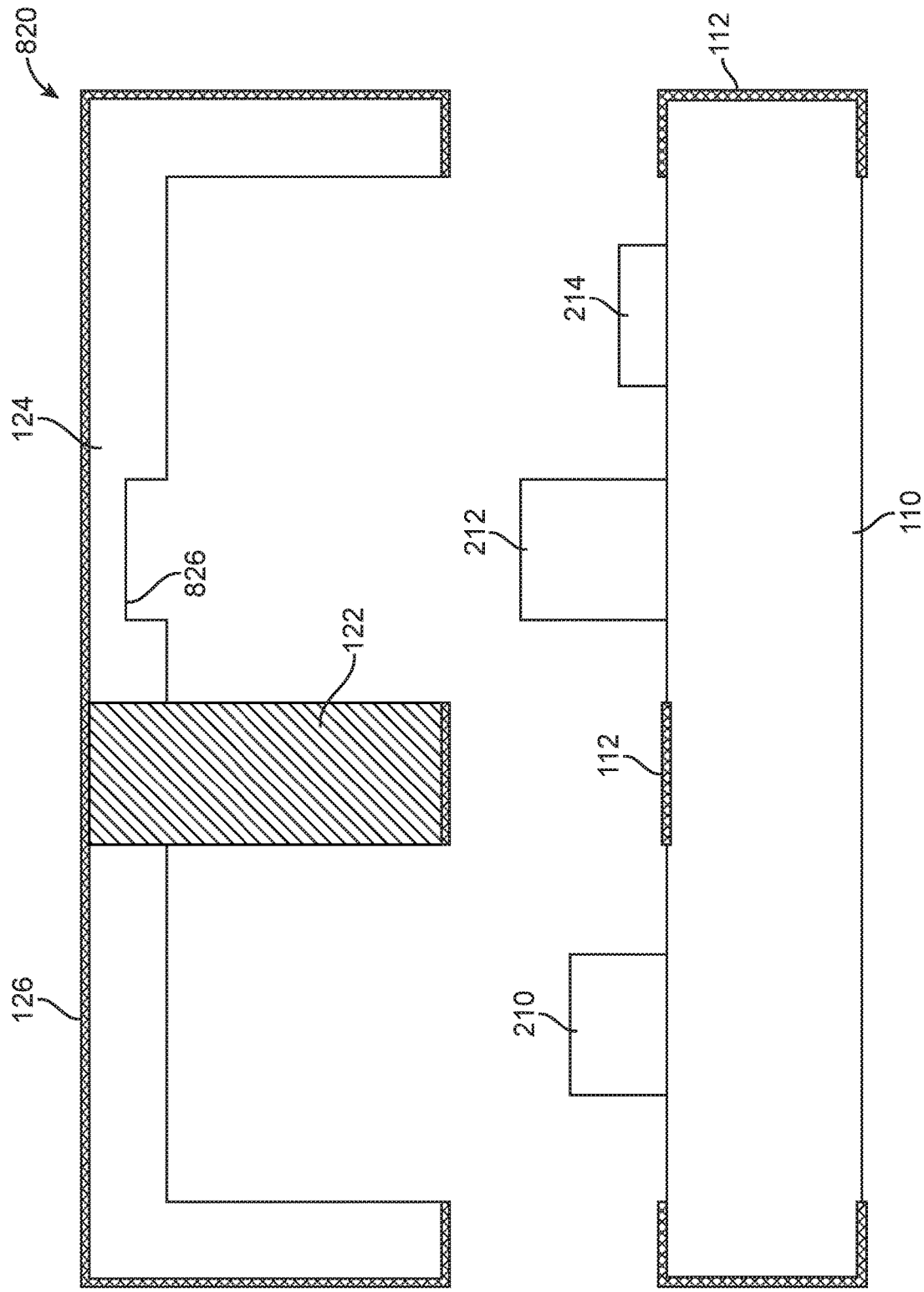
FIG. 8 illustrates a step in an assembly of system-in-a-package module according to an embodiment of the present invention.

FIG. 8 illustrates a step in an assembly of system-in-a-package module according to an embodiment of the present invention. In this example, cover 820 may be formed of housing 124, which may be plated with layer 126. One or more posts 122 may be included. One or more recesses 826 may be formed in a bottom surface of a horizontal top portion of cover 820. In this example, recess 826 is arranged to accept component 212. That is, recess 826 may arranged such that when cover 820 is mated with printed circuit board or other appropriate substrate 110, a portion of electrical or mechanical components 212 may fit in recess 826. An example is shown in the following figure.

Figure 9:
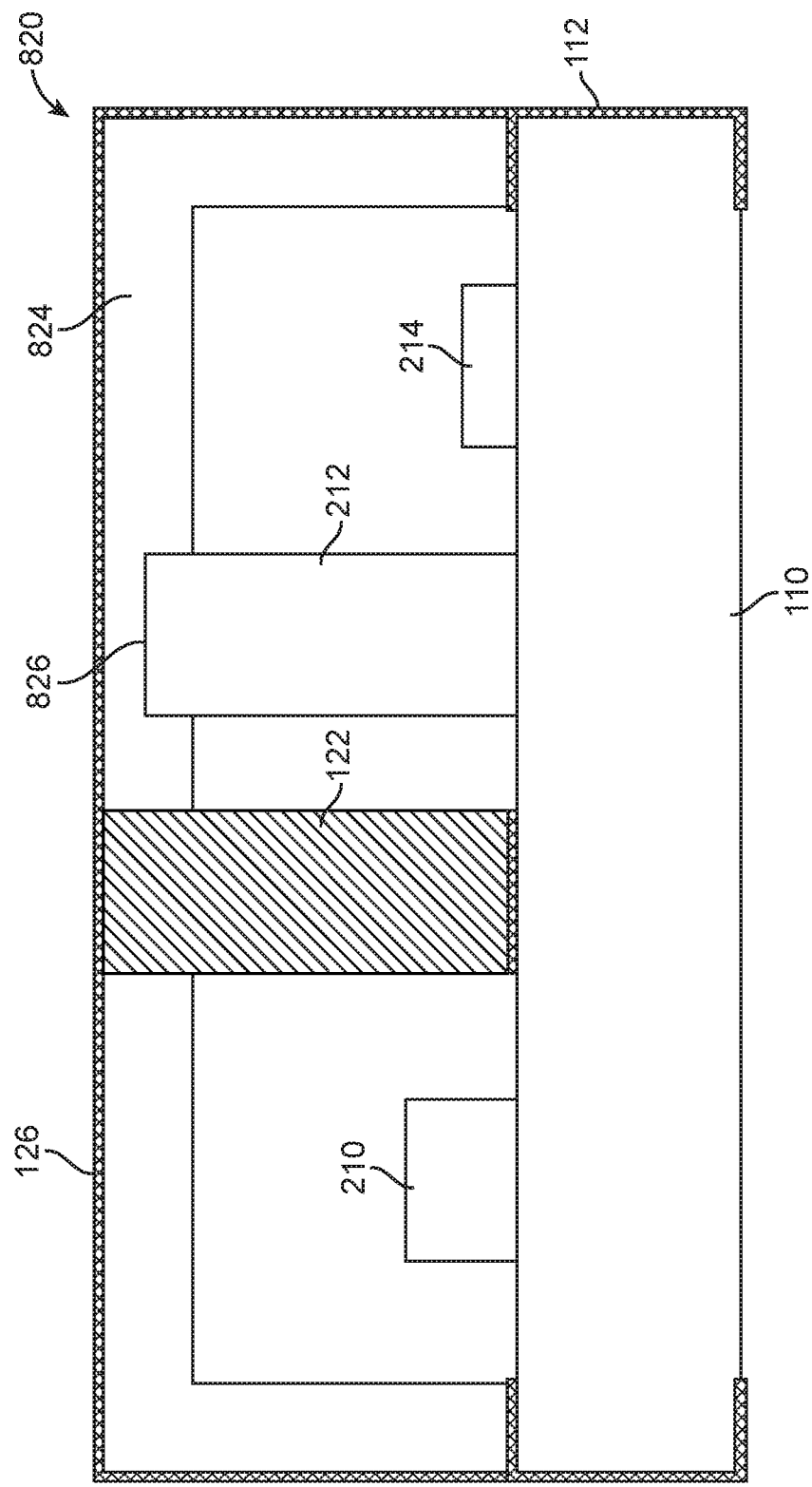
FIG. 9 illustrates a side view of a portion of a system-in-a-package module according to an embodiment of the present invention.

FIG. 9 illustrates a side view of a portion of a system-in-a-package module according to an embodiment of the present invention. In this example, a top portion of electrical or mechanical components 212 may fit in recess 826. In this way, an overall profile of the system-in-a-package module may be reduced. For example, a thickness of cover 820 over electrical or mechanical component 212 may be thinner than what may normally be allowed, since the cover has this reduce thickness for only a limited lateral distance over component 212.

In various embodiments of the present invention, this concept may be extended to the point where there is no or only a limited cavity over printed circuit board or other appropriate substrate 110. An example is shown in the following figure.

Figure 10:
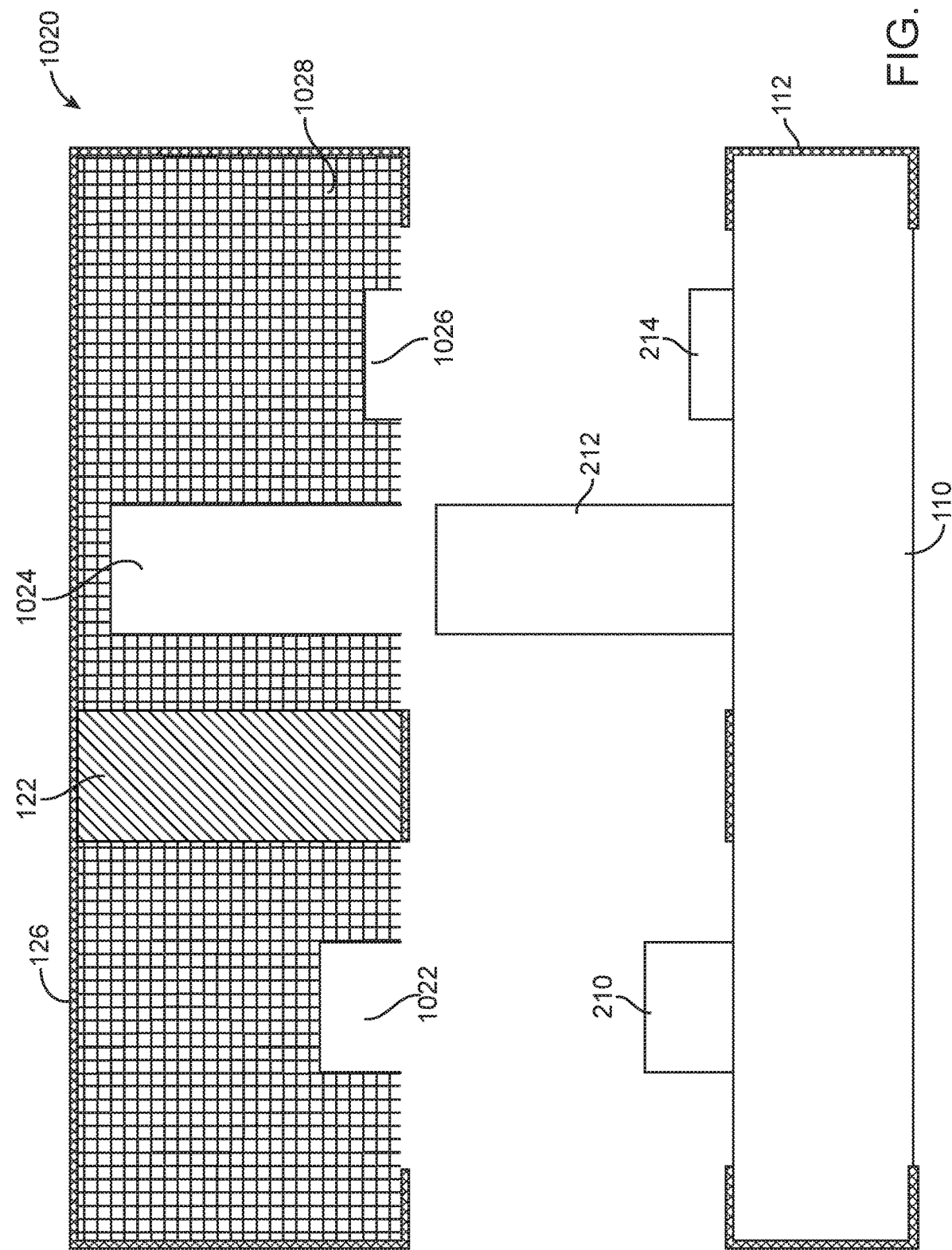
FIG. 10 illustrates a step in an assembly of a system-in-a-package module according to an embodiment of the present invention.

FIG. 10 illustrates a step in an assembly of a system-in-a-package module according to an embodiment of the present invention. In this example, cover 1020 may have a housing 1028 having recesses 1022, 1024, and 1026 to accept electrical or mechanical components 210, 212, and 214. In this way, when joined, a cavity between cover 120 and circuit board 110 may be limited in size or nonexistent. This may provide a high degree of moisture leakage prevention.

Figure 11:
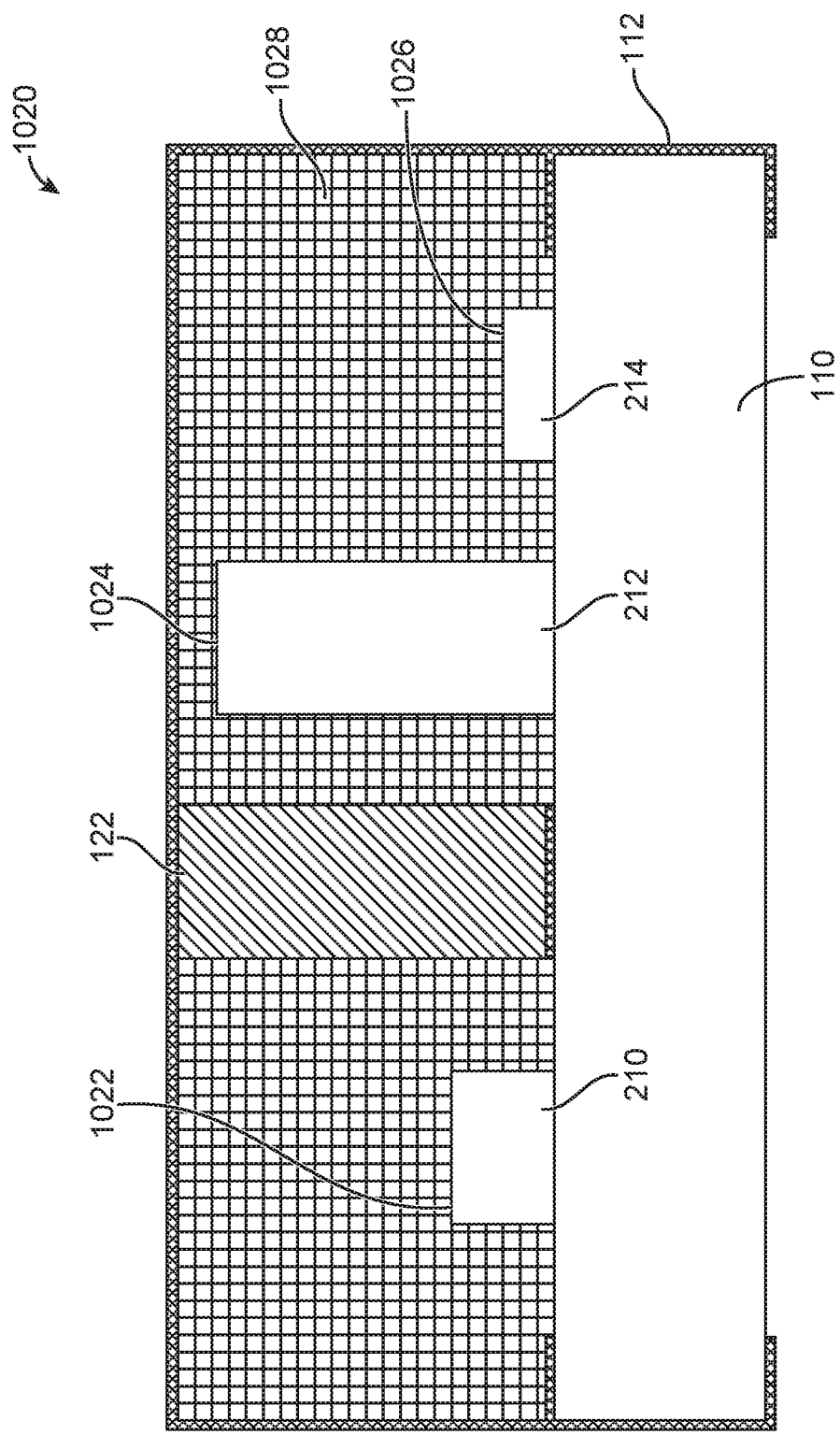
FIG. 11 illustrates a side view of a portion of a system-in-a-package module according to an embodiment of the present invention.

FIG. 11 illustrates a side view of a portion of a system-in-a-package module according to an embodiment of the present invention. In this example, recesses 1022, 1024, and 1026 accept electrical or mechanical components 210, 212, and 214 on a top surface of printed circuit board or other appropriate substrate 110.

In other embodiments of the present invention, other potting materials may be used to increase a resistance to moisture leakage. Examples are shown in the following figures.

Figure 12:
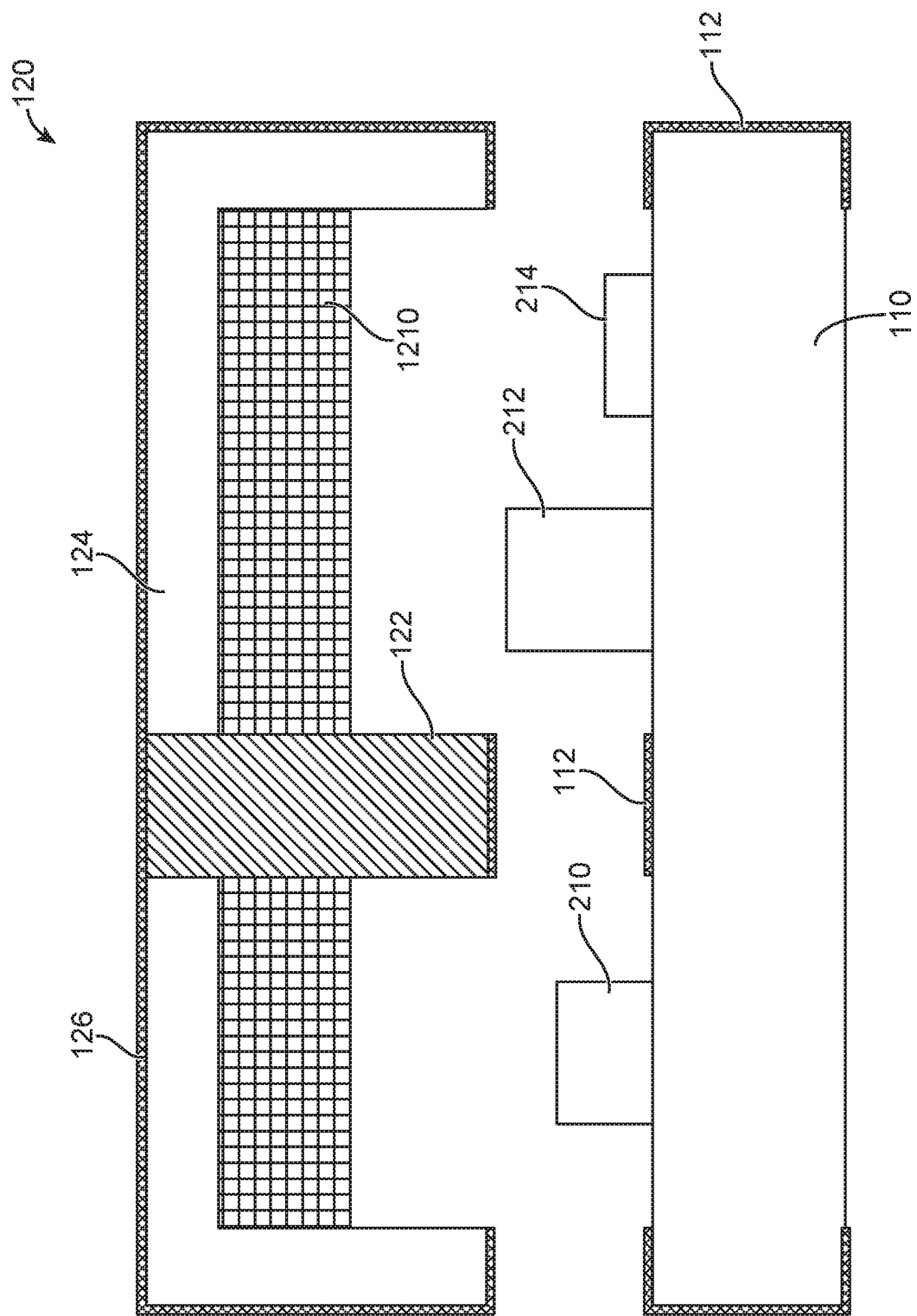
FIG. 12 illustrates a step in assembly of a system-in-a-package module according to an embodiment of the present invention.

FIG. 12 illustrates a step in assembly of a system-in-a-package module according to an embodiment of the present invention. In this example, epoxy or other potting material 1210 at least partially fills a cavity formed by housing 124 in cover 120. When cover 120 is placed on printed circuit board or other appropriate substrate 110, epoxy 1210 may help seal and protect electrical or mechanical components 210, 212, and 214.

Figure 13:
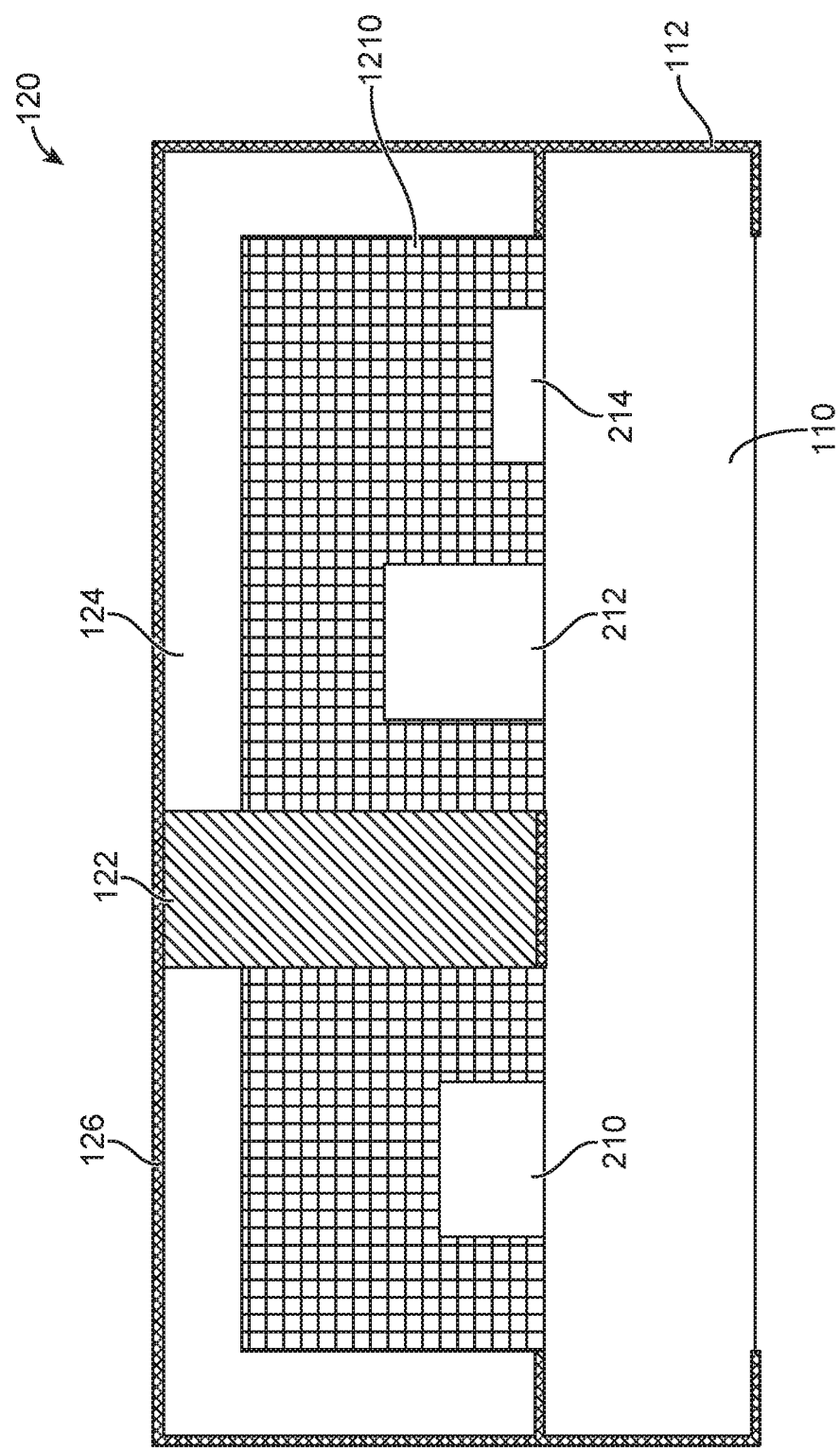
FIG. 13 illustrates a side view of a portion of a system-in-a-package module according to an embodiment of the present invention.

FIG. 13 illustrates a side view of a portion of a system-in-a-package module according to an embodiment of the present invention. In this example, cover 120 has been attached to printed circuit board or other appropriate substrate 110. Epoxy or other potting material 1210 may fill some or all of the recess formed by housing 124 of cover 120. This epoxy may then seal and protect electrical or mechanical components 210, 212, and 214 form moisture leakage.

In various embodiments of the present invention, one or more of the above techniques may be used in conjunction each other. An example is shown in the following figure.

Figure 14:
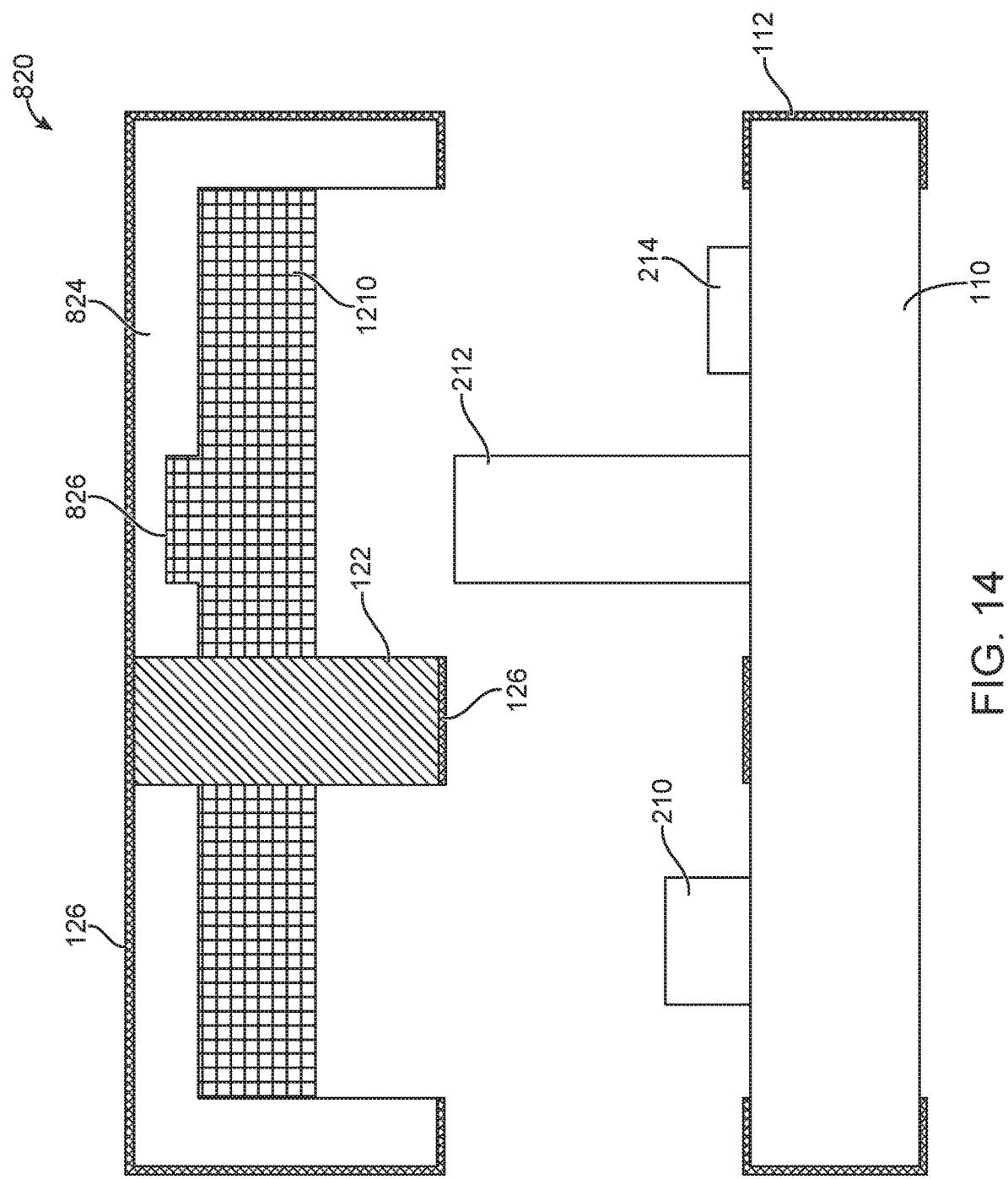
FIG. 14 illustrates a step in an assembly of a system-in-a-package module according to an embodiment of the present invention.

FIG. 14 illustrates a step in an assembly of a system-in-a-package module according to an embodiment of the present invention. Once again, cover 820 may include housing 124 having a recess 826. Recess 826 may be arranged to accept electrical or mechanical component 212.

Figure 15:
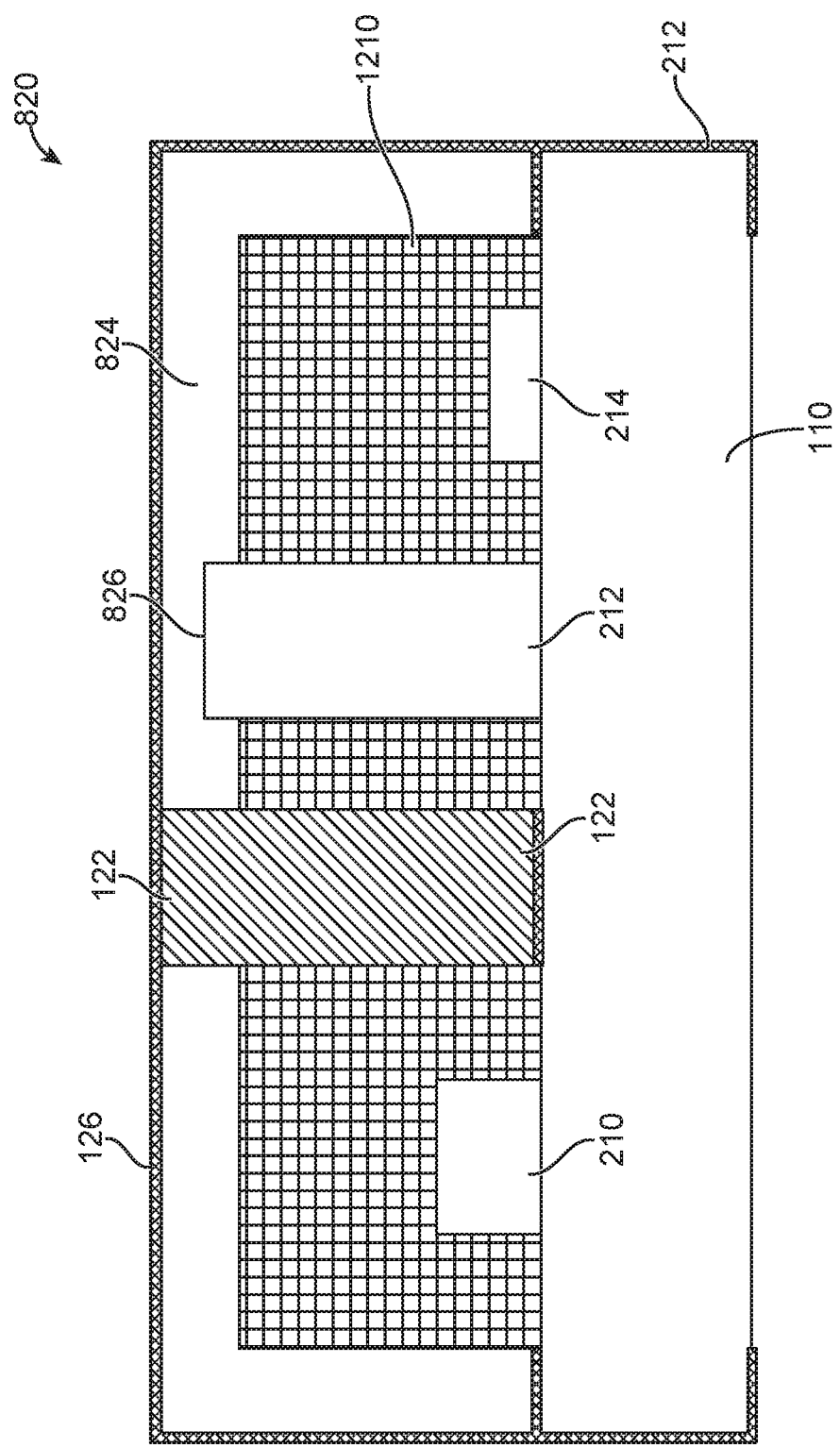
FIG. 15 illustrates a side view of a portion of a system-in-a-package module according to an embodiment of the present invention.

FIG. 15 illustrates a side view of a portion of a system-in-a-package module according to an embodiment of the present invention. As before, electrical or mechanical component 212 may fit in recess 826 in housing 124 in cover 120. The epoxy or other potting materials 1210 may fill in at least some of the remaining cavity to help protect electrical or mechanical components 210, 212, and 214 from moisture leakage.

In various embodiments of the present invention, a SIP module may be formed by attaching one or more electrical components to a top of a printed circuit board or other appropriate substrate or other substrate then covering the one or more electrical components with a plated cover. During the attachment of the cover, it may be undesirable to heat the printed circuit board or other appropriate substrate to a point where the one or more electrical components may become detached. The same concerns may arise when one or more other components are attached to a bottom surface of the printed circuit board or other appropriate substrate. An example of one way of mitigating this problem in accordance with an embodiment of the present invention is shown in the following figure.

Figure 16:
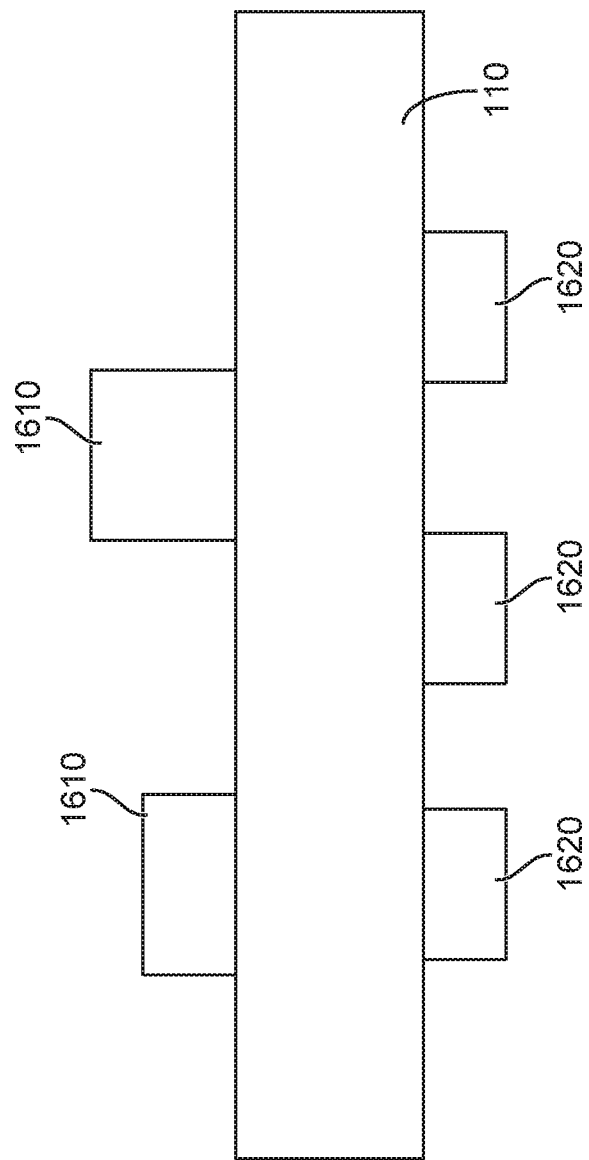
FIG. 16 illustrates a side view of at least a portion of a printed circuit board or other appropriate substrate according to an embodiment of the present invention.

FIG. 16 illustrates a side view of at least a portion of a printed circuit board or other appropriate substrate according to an embodiment of the present invention. In this example, one or more electrical or mechanical components 1610 are attached to a top of printed circuit board or other appropriate substrate 110 while one or more electrical or mechanical components 1620 are attached to a bottom of printed circuit board or other appropriate substrate. Components 1610 and 1620, as with the other components shown herein and in other embodiments of the present invention, may be electrical or electromagnet components such as passive components, such as capacitors and resistors, or active components, such as diodes, transistors, or integrated circuits such as a chip-scale package or flip-chip, may be attached to a top surface of a molded substrate having a number of first conductive paths. Again it may be undesirable to have components 1610 detach when components 1620 are attached. Accordingly, embodiments of the present invention may use soldering materials that have different melting temperatures. For example, the solder or other material used to fix components 1610 on a top side of a printed circuit board or other appropriate substrate may have a higher melting temperature than the solder or other material used to fix a cover to a top of the printed circuit board or other appropriate substrate. Similarly, the solder or other material used to fix one or more components 1610 on a top side of a printed circuit board or other appropriate substrate may have a higher melting temperature than the solder or other material used to fix components 1620 to a bottom of the printed circuit board or other appropriate substrate. In a specific embodiment of the present invention, the higher melting point material may be a compound including tin, silver, and copper, while the lower melting point material may be a compound such as a tin and antimony alloy, or a tin and bismuth alloy.

In the examples above, one or more electrical or mechanical components may be individually placed on a top surface of a printed circuit board. In various embodiments of the present invention, a greater efficiency in device assembly may be achieved by placing multiple electrical or mechanical components as a unit. Accordingly, embodiments of the present invention may provide modules including multiple electrical or mechanical components that may be placed on a surface of a printed circuit board as a unit. Treating multiple components as a single component may simplify assembly, thereby reducing costs. Also, components in a module may be able to be placed closer together than components on a board are allowed to be spaced, thereby saving space and further reducing costs. An example is shown in the following figure.

Figure 17:
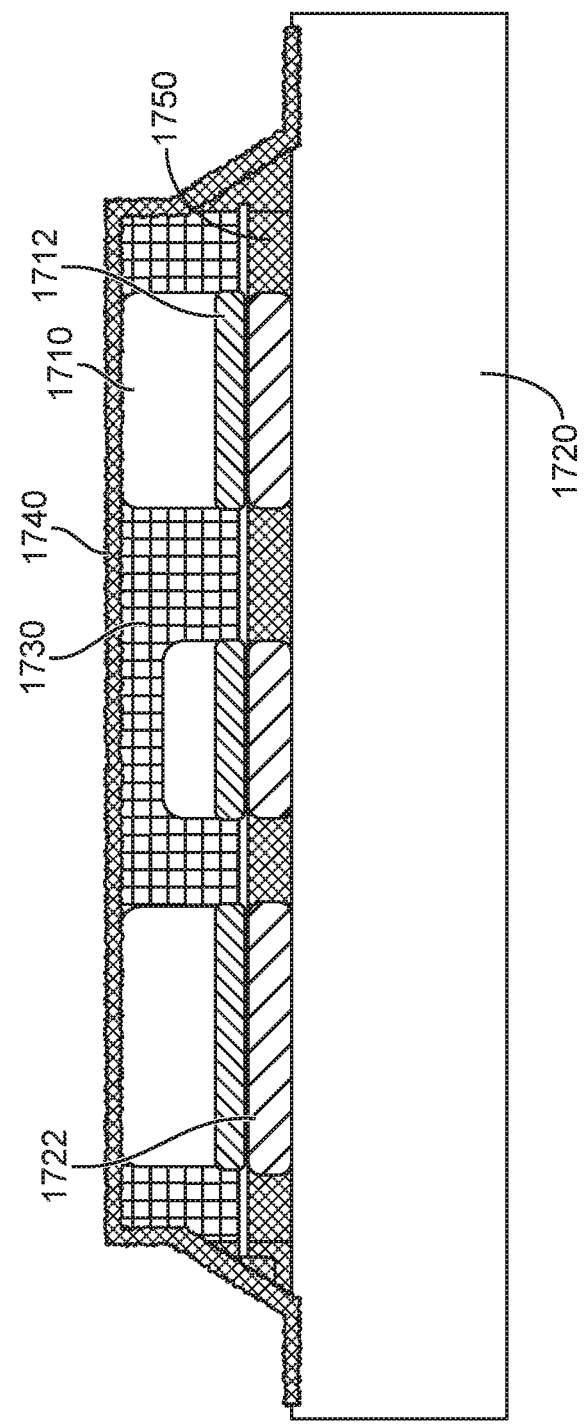
FIG. 17 illustrates a module according to an embodiment of the present invention attached to a top surface of a printed circuit board.

FIG. 17 illustrates a module according to an embodiment of the present invention attached to a top surface of a printed circuit board. In this example, a number of components 1710 having contacts 1712 may be encapsulated in a molding 1730 to form a module. Components 1710, as with the other components shown here and in other embodiments of the present invention, may be electrical or electromagnet components such as passive components, such as capacitors and resistors, or active components, such as diodes, transistors, or integrated circuits such as a chip-scale package or flip-chip, may be attached to a top surface of a molded substrate having a number of first conductive paths. This module may be attached to contacts 1722 on a top surface of printed circuit board or other appropriate substrate 1720. A backfill or under-fill 1750 may be used to fill areas under molding 1730. A shield 1740 may be formed over top and sides of the module. Shield 1740 may be formed by plating, sputtering, vapor deposition, or other technique. Shield 1740, and the other shields described herein, may be formed using a cap as shown in the above examples. Shield 1740, and the other shields shown herein as being formed over (or under) moldings, such as molding 1730, may be made using a molding material formed as a sheet laminated to a copper or other type of conductive layer. This may be used to form a conductive cap or shield 1740 on top of the molding 1730. In other embodiments of the present invention, molding 1730 may be omitted in favor of using the sheet of molding material over components 1710. Shield 1740 may be grounded by side plating or vias through board 1720, as before.

In various embodiments of the present invention, it may be desirable to isolate some components 1710 from other components in the module. This may be done using one or more posts or walls, such as posts or walls 122 above, or other posts or walls provided by embodiments of the present invention. These posts or walls, such as posts or walls 122 and the other posts or walls shown here may be formed of aluminum, steel, copper, or other conductive material. These posts or walls may be formed by stamping, forging, metallic injection molding (MIM), machining, micro-machining, or other manufacturing technique. In still other embodiments of the present invention, these posts or walls may be formed of a conductive adhesive. These conductive adhesive posts or walls may be formed using printing, stenciling, or other appropriate technique. These posts or walls may extend from a shield, such as shield 1740, to a contact, plating, or other conductive portion on a bottom side of the module.

This module may be formed in various ways. An example is shown in the following figures.

Figure 18:
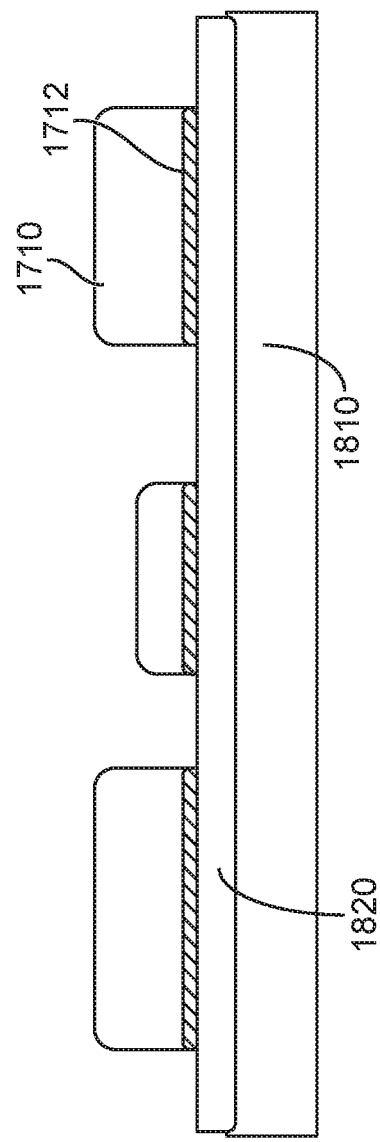
FIGS. 18-21 illustrate a method of forming a module according to an embodiment of the present invention.

FIGS. 18-21 illustrate a method of forming a module according to an embodiment of the present invention. In FIG. 18, one or more components 1710 having contacts 1712 may be attached to a top surface of a carrier 1810. The top surface of carrier 1810 may be covered with an adhesive film 1820 to help secure components 1710 in place. That is, the top surface of carrier 1810 may be covered with an adhesive and the components 1710 may be placed on top of the adhesive such that the adhesive holds the components 1710 in place. This film 1820 may have various thicknesses. The thickness of this film 1820 may dictate and amount of contacts 1712 that are exposed following encapsulation or molding, as is shown below.

Figure 19:
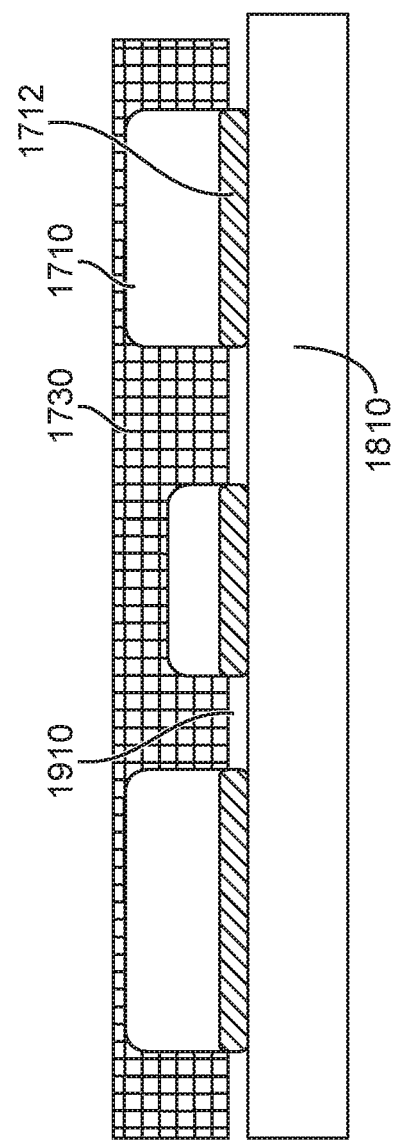

In FIG. 19, a molding 1730 may be formed around components 1710. In this particular example, the film 1910 may be relatively thick, such that it forms voids that are not filled with mold 1730. That is, the film 1910 may be relatively thick and compressed by components 1710 during their attachment. The film 1910 between the components 1710 and carrier 1810 may compress, while the film 1910 between components 1710 may remain uncompressed and near their original thickness. During molding, the thick film 1910 may prevent the mold 1730 from entering areas between contacts 1712. Once the film 1910 is removed, voids between contacts 1712 may remain thereby exposing portions of contacts 1712, as is shown below.

Figure 20:
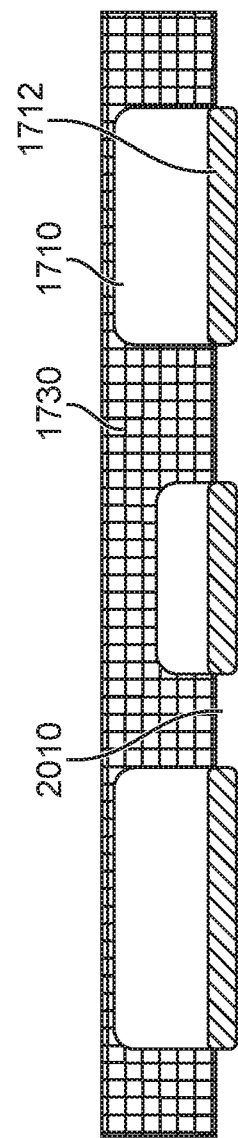

In FIG. 20, the carrier 1810 and film 1910 have been removed. A module including components 1710 held together by plastic molding 1730 is thus formed. An amount of contacts 1712, particularly along the sides of the contacts, may be exposed. The amount of the contacts that are exposed may be dictated by a thickness of film 1910, the presence of which creates voids 2010.

Figure 21:
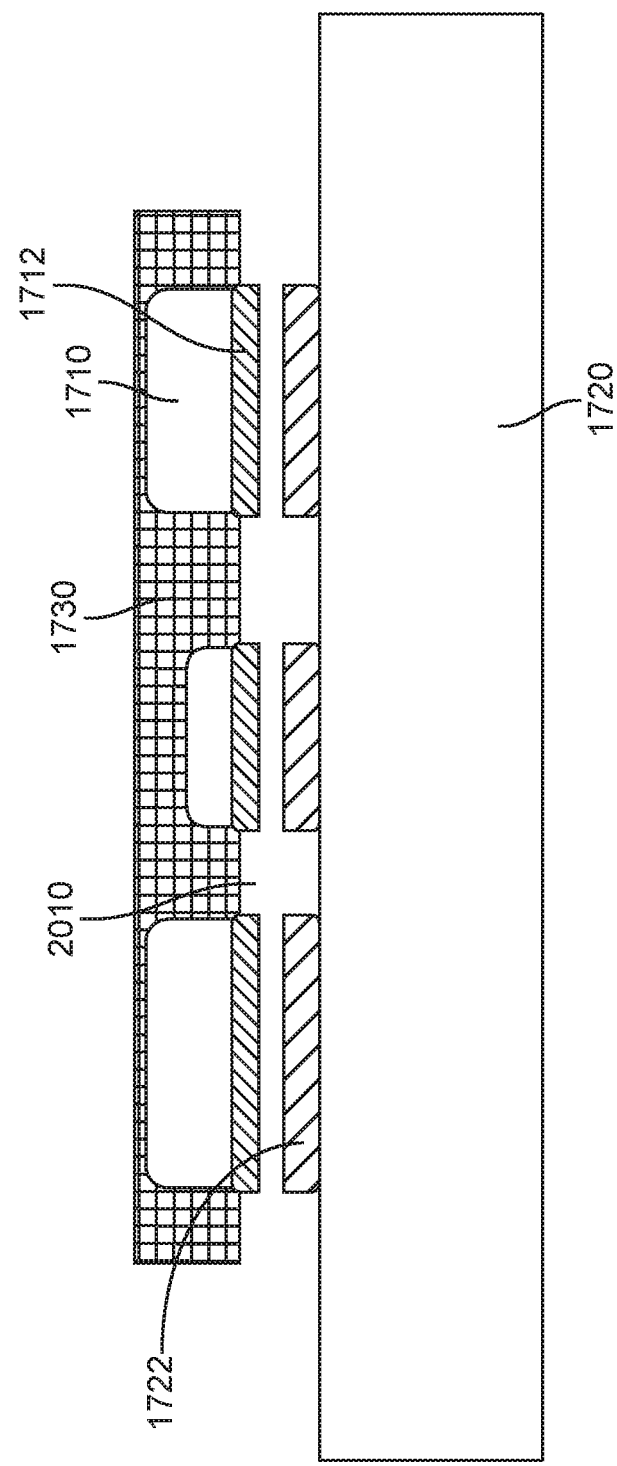

In FIG. 21, the resulting module may be attached to a printed circuit board. Specifically, one or more components 1710 may be held together by encapsulation or mold 1730. The components may include contacts 1712. Contacts 1712 may form electrical connections with contacts 1722 on a top surface of printed board 1720. An undermold or under fill may be used to fill voids 2010. A shield may be formed on top and sides of the module to generate the structure shown in FIG. 17 above.

In the above example, a film placed on the carrier during the manufacture of the module is relatively thick and thereby generated voids 2010. This may be useful where component contacts 1712 are being directly connected to contacts 1722 on board 1720. In other embodiments of the present invention, this film may be relatively thin such that a bottom surface of a resulting module is relatively flat. This flatter surface may be particularly useful where contacts of components in a module are closer together than corresponding contacts may be printed on a top surface of a board. Specifically, a relatively flat surface may be covered with a passivation layer. This passivation layer may be formed using a conformal coating or solder mask, polyamide, or other material. Openings in the passivation layer may be formed under contacts of the components. These openings may be narrower than a width of the contacts in at least one direction. The narrower width may increase spacing between contacts such that corresponding contacts may be reliably printed on a top surface of the board. An example is shown in the following figure.

Figure 22:
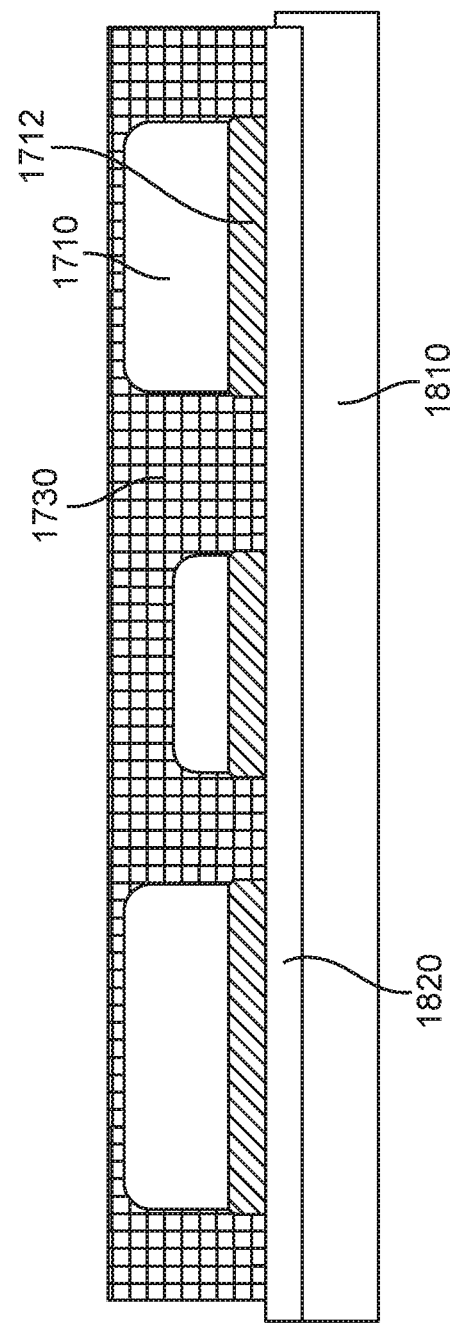
FIG. 22 illustrates another method of forming a module according to an embodiment of the present invention.

FIG. 22 illustrates another method of forming a module according to an embodiment of the present invention. In this example, a number of components 1710 having contacts 1712 may be placed on carrier 1810 and encapsulated in a mold 1730. An adhesive film 1820 may be used on a top surface of carrier 1810 to hold components 1710 in place during encapsulation. Following encapsulation, carrier 1810 and the adhesive film 1820 may be removed.

Figure 23:
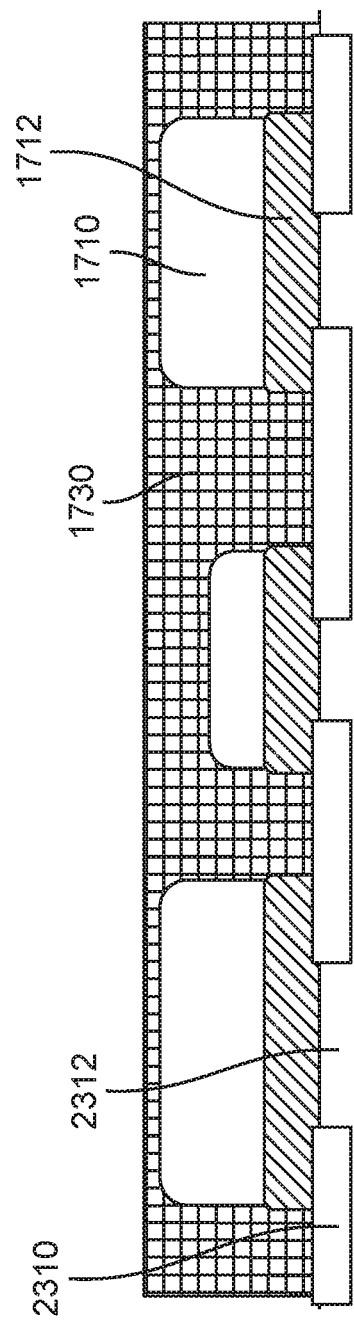
FIG. 23 illustrates a module including a passivation layer having openings according to an embodiment of the present invention.

FIG. 23 illustrates a module including a passivation layer having openings according to an embodiment of the present invention. In this figure, the carrier 1810 and film 1820 in FIG. 22 have been removed. A passivation layer 2310 has been formed and patterned on a bottom side of the module.

In this way, a number of electrical or mechanical components 1710 having contacts 1712 may be encapsulated in a mold 1730. Since a relatively thin adhesive layer was used during manufacturing, a bottom side of the module may be relatively flat. A passivation layer 2310 may be formed on this bottom surface. The formation of this layer is assisted by the bottom side of the module being relatively flat. Openings 2312 may be formed in the passivation layer by etching or other technique. Openings 2312 may be narrower than contacts 1712 in at least one direction. This narrowing may allow corresponding contacts on a top surface of the board to be more readily and reliably printed.

Figure 24:
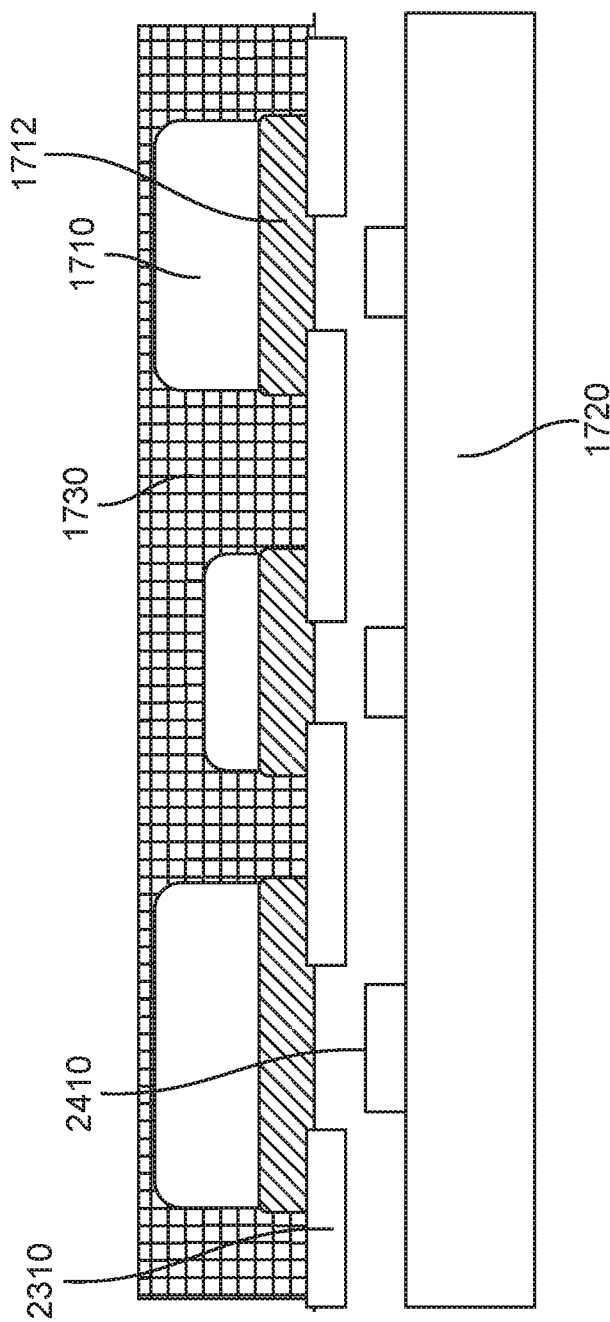
FIG. 24 illustrates a module according to an embodiment of the present invention being attached to a printed circuit board or other appropriate substrate.

FIG. 24 illustrates a module according to an embodiment of the present invention being attached to a printed circuit board or other appropriate substrate. In this example, the module formed in FIG. 23 is being attached to board 1720. Again, one or more electrical or mechanical components 1710 having contacts 1712 may be encapsulated in mold 1730. A passivation layer 2310 may be formed on a bottom side of the module. Openings in passivation layer 2310 may allow electrical connections to be formed between contacts 2410 on board 1720 and exposed portions of contacts 1712 on components 1710.

In these and other embodiments of the present invention, it may be desirable to redistribute or reposition contacts on a bottom of a module to facilitate connecting the module to a printed circuit board. In an illustrative embodiment of the present invention, a redistribution layer may be used. In one such example, before passivation layer 2310 is formed on the bottom side of the module, a metal layer may be formed and patterned on the bottom side of the module. The metal layer may be patterned to make contacts 1712 of the components 1710 accessible at different locations on the module. The metal layer may also be patterned to provide a shield. A passivation layer may then be added as before. An example is shown in the following figure.

Figure 25:
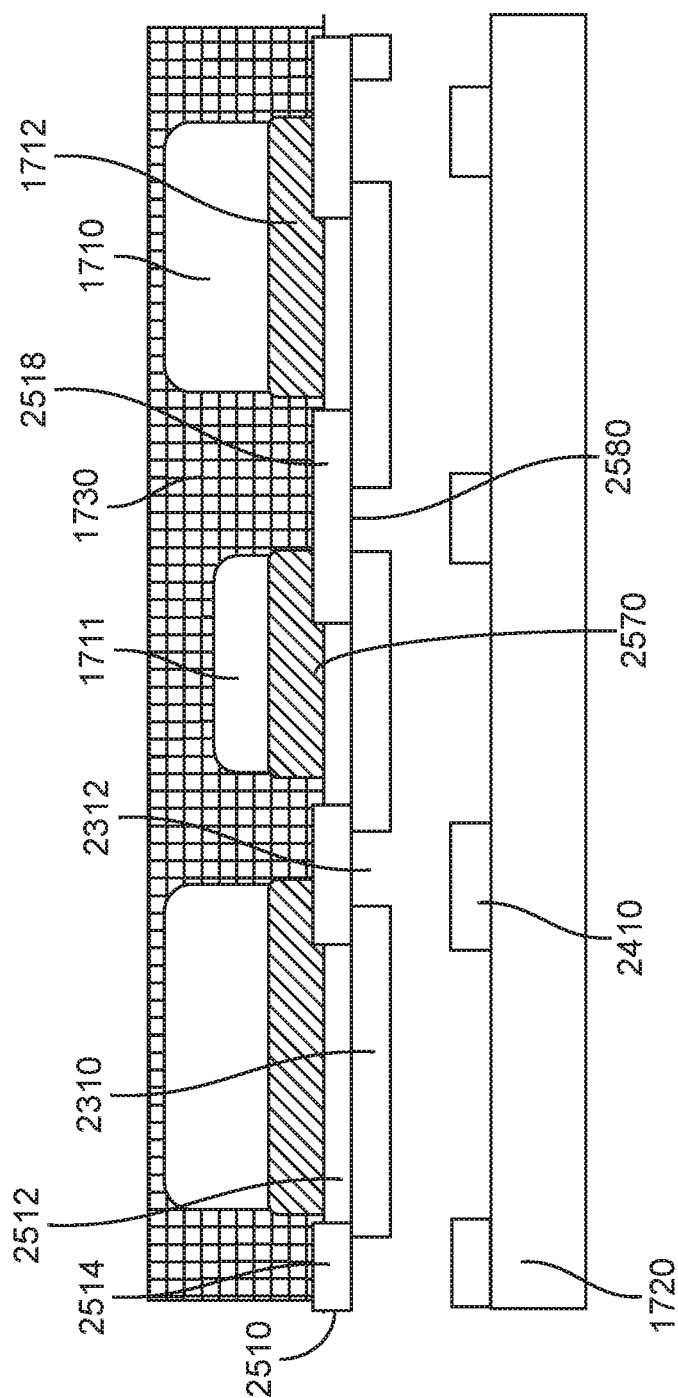
FIG. 25 illustrates another module according to an embodiment of the present invention being attached to a printed circuit board or other appropriate substrate.

FIG. 25 illustrates another module according to an embodiment of the present invention being attached to a printed circuit board or other appropriate substrate. Again, one or more electrical or mechanical components 1710 having contacts 1712 may be encapsulated in mold 1730. A metal layer 2510 may be formed and patterned to have openings 2512 on a bottom side of the module. The metal layer 2510 may be patterned to allow contacts 1712 of the components 1710 to be accessible at different locations on the module. The metal layer 2510 may also be patterned to provide a shield. Passivation layer 2310 may be formed on a bottom side of the module. Openings 2312 in passivation layer 2310 may allow electrical connections to be formed between contacts 2410 on board 1720 and contacts 1712 on components 1710 via metal layer 2510. More specifically, contact 1712 on component 1711 would, without layer 2510, be contacted at point 2570. With metal or redistribution layer portion 2518, contact 1712 on component 1711 may be contacted at point 2580. Also, metal or redistribution layer portion 2514 may be part of a shield under or around the module.

Figure 26:
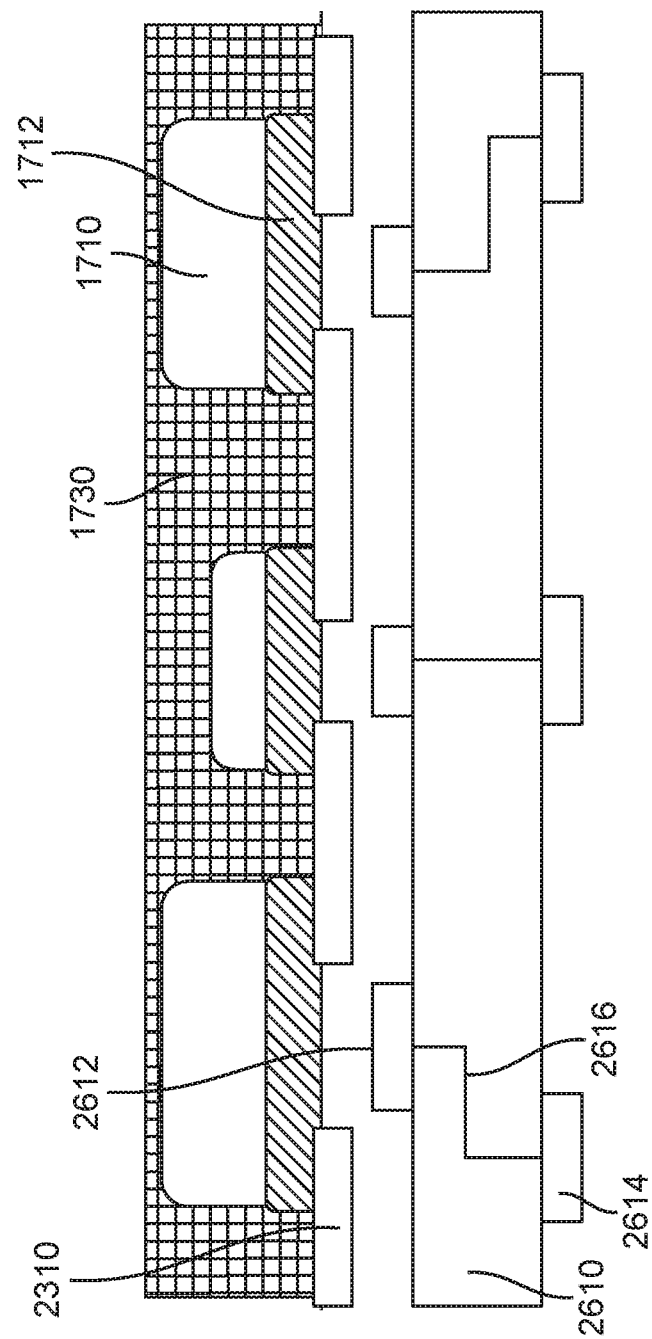
FIG. 26 illustrates a module including a redistribution layer according to an embodiment of the present invention.

FIG. 26 illustrates a module including another redistribution layer according to an embodiment of the present invention. Again, one or more electrical or mechanical components 1710 having contacts 1712 may be located in a mold 1730. A passivation layer 2310 having openings may be formed on a bottom side of the module. A redistribution layer 2610 having contacts 2612 on a top side and contacts 2614 on a bottom side may be attached to a bottom of the module. Specifically, contacts 2612 may be attached and electronic connected to contacts 1712 on components 1710. Contacts 2612 and 2614 may be connected via traces 2616. Contacts 2614 may be arranged to facilitate their connection to a top surface of a printed circuit board (not shown.) For example, contacts 2614 may be spaced to allow the formation of corresponding contacts on a top side of a printed circuit board or other appropriate substrate. In various embodiments of the present invention, these and the other modules may be shielded. This shielding may be done using a cap as in the above examples. The shielding may also be done using plating, sputtering, vapor deposition, or other technique.

This and the other redistribution layers provided by embodiments of the present invention may be formed in various ways. For example, a redistribution layer may be formed on a top layer of a printed circuit board or other appropriate substrate (not shown.) A redistribution layer may instead be formed as a layer on a bottom side of the module. In still other embodiments of the present invention a redistribution layer may be formed as a separate layer. The module and printed circuit board may then be attached. An example where a redistribution layer is formed on a bottom of a module is shown in the following figures.

Figure 27:
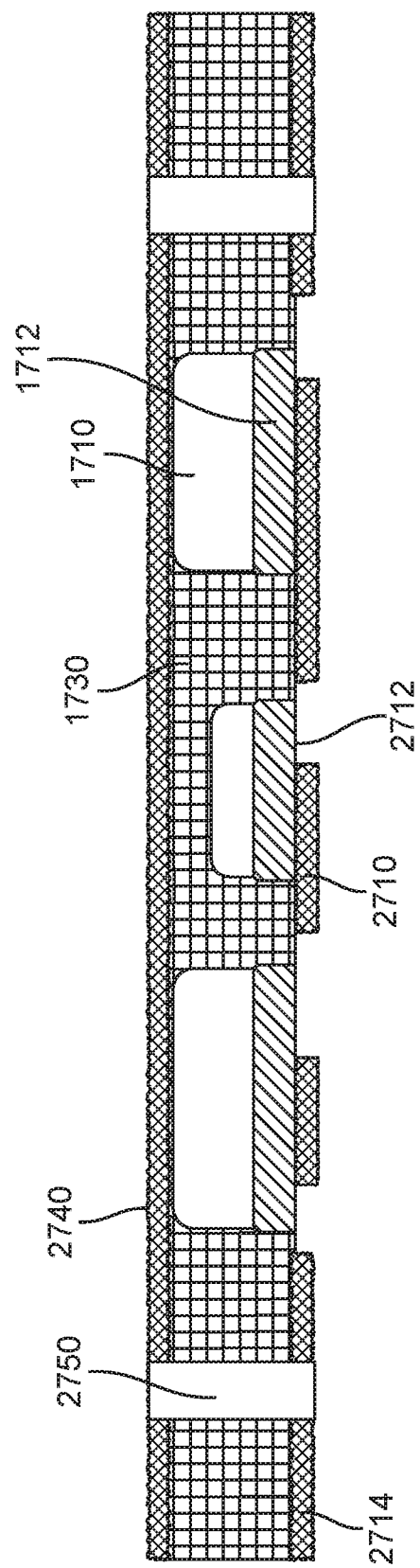
FIG. 27 illustrates a portion of a module including a redistribution layer according to an embodiment of the present invention.

FIG. 27 illustrates a step in a manufacturing of a module including a redistribution layer according to an embodiment of the present invention. One or more electrical or mechanical components 1710 having contacts 1712 may be located in a mold 1730. A metal or redistribution layer 2710 may be formed on a bottom side of the module and patterned to have openings 2712. At least a portion 2714 of the metal or redistribution layer 2710 may be used to provide shielding. Vias 2750 may connect a top shield 2740 to bottom metallization 2714 used as shielding. The top shield 2740, bottom shield portions 2714, and vias 2750 may form a Faraday cage to shield components 1710. The top shield 2740 and bottom metal layer 2710 may be formed by plating, sputtering, vapor deposition, or other technique. One or more of these shields may be formed using a cap, as shown in the examples above. Shield 2740, and the other shields shown herein, may be made using a molding material formed as a sheet laminated to a copper or other type of conductive layer. This may be used to form a conductive cap or shield 2740 on top of the molding 1730. In other embodiments of the present invention, molding 1730 may be omitted in favor of using the sheet of molding material over components 1710.

Figure 28:
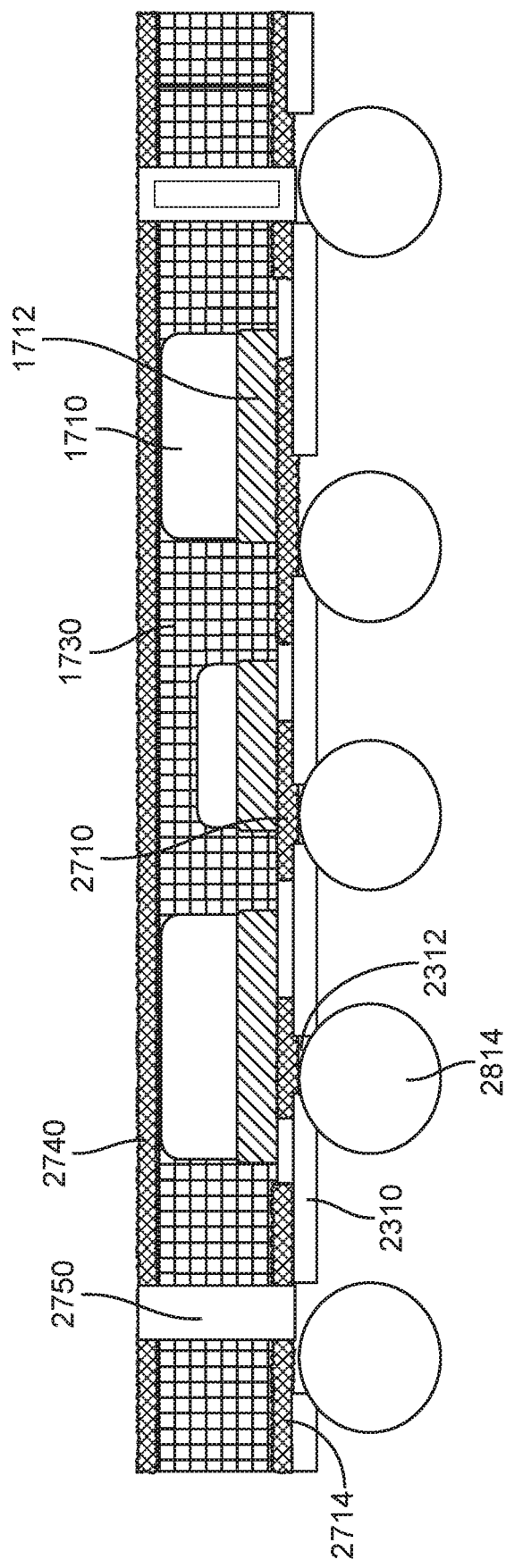
FIG. 28 illustrates another module including a redistribution layer according to an embodiment of the present invention.

FIG. 28 illustrates another module including a redistribution layer according to an embodiment of the present invention. One or more electrical or mechanical components 1710 having contacts 1712 may be located in a mold 1730. A metal or redistribution layer 2710 may be formed on a bottom side of the module. A passivation layer 2310 having openings 2312 may be formed on a bottom side of the metal layer 2710. Contacts 2814 may be formed at openings 2312 in passivation layer 2310. Contacts 2814 may be arranged to facilitate their connection to a top surface of a printed circuit board (not shown.) For example, contacts 2814 may be spaced to allow the formation of corresponding contacts on a top side of a printed circuit board or other appropriate substrate. Metal redistribution layer 2710 may also be used to form shielding 2714 on a bottom side of the module. Vias 2750 may connect top side shield 2740 to this shielding 2714 on the bottom side of the module.

This module may be formed in various ways. For example, components 1710 may be mounted on an adhesive film covered substrate or carrier as before. This attachment may be done for multiple modules as a unit. Molding 1730 may then be applied over components 1710. Vias 2750 and top shield 2740 may be formed. The adhesive film and carrier may be removed. The metal or redistribution layer 2710 may be formed and patterned under the module. A passivation layer 2310 may be formed and openings 2312 may be patterned under the metal layer. Solder bumps or contacts 2814 may be formed at openings 2312. The individual modules may be singulated or separated at this time.

In the above modules, and in other modules provided by embodiments of the present invention, it may be desirable to isolate some components from other components in the module. This may be done using one or more posts or walls, such as posts or walls 122 above, or other posts or walls provided by embodiments of the present invention. These posts or walls, such as posts or walls 122 and the other posts or walls shown here may be formed of aluminum, steel, copper, or other conductive material. These posts or walls may be formed by stamping, forging, metallic injection molding (MIM), machining, micro-machining, or other manufacturing technique. In still other embodiments of the present invention, these posts or walls may be formed of a conductive adhesive. These conductive adhesive posts or walls may be formed using printing, stenciling, or other appropriate technique. These posts or walls may extend from a shield, such as shield 2740, to a contact, plating, or other conductive portion, such as shield portion 2714, on a bottom side of the module.

In various embodiments of the present invention, modules, such as the module shown in FIG. 17, may be attached to a board or other substrate in various ways. An example is shown in the following figure.

Figure 29:
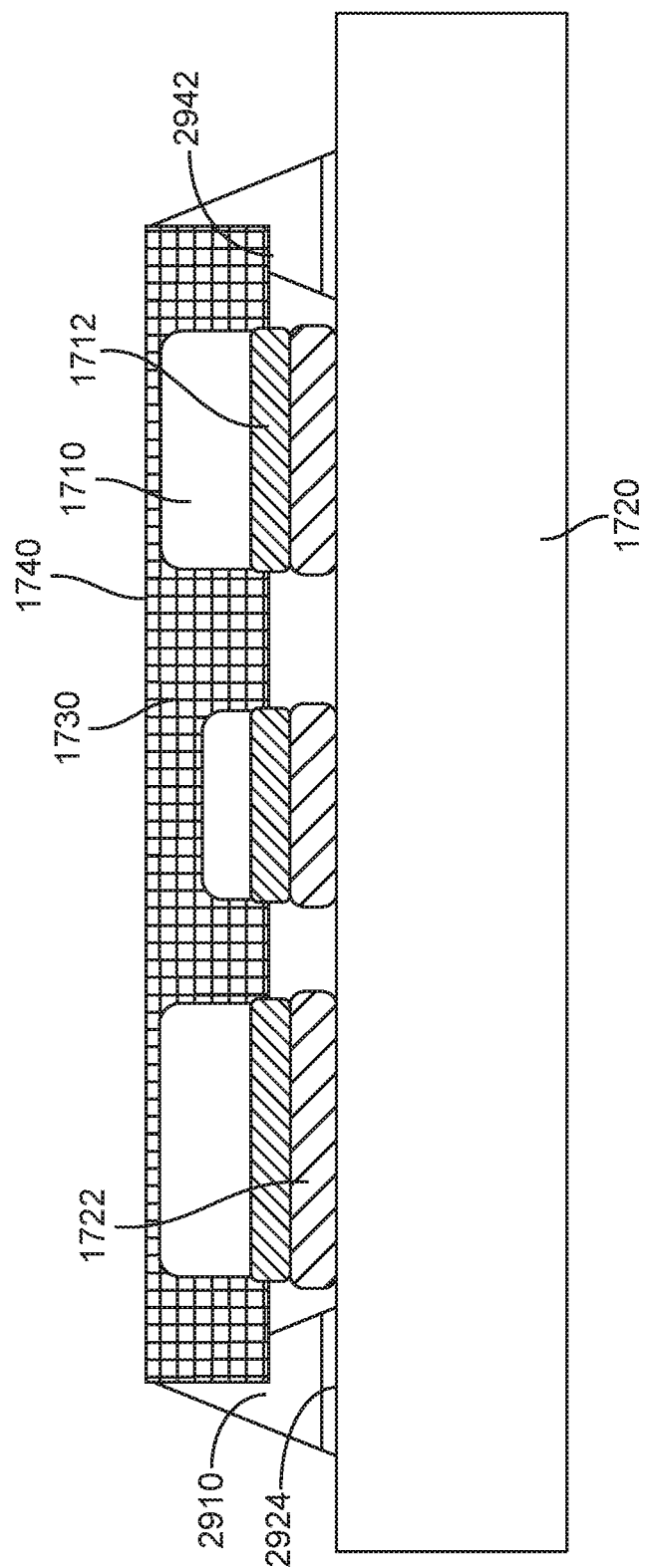
FIG. 29 illustrates a module according to an embodiment of the present invention attached to a top surface of a printed circuit board.

FIG. 29 illustrates a module according to an embodiment of the present invention attached to a top surface of a printed circuit board. As in above examples such as the module in FIG. 17, a number of components 1710 having contacts 1712 may be encapsulated in a molding 1730 to form a module. This module may be attached to contacts 1722 on a top surface of printed circuit board or other appropriate substrate 1720. A shield 1740 may be formed over top and sides of the module. Shield 1740 may be formed by plating, sputtering, vapor deposition, or other technique. Again, shield 1740, and the other shields described herein, may be formed using a cap as shown in the above examples. Shield 1740, and the other shields shown herein as being formed over (or under) moldings, such as molding 1730, may be made using a molding material formed as a sheet laminated to a copper or other type of conductive layer. This may be used to form a conductive cap or shield 1740 on top of the molding 1730. In other embodiments of the present invention, molding 1730 may be omitted in favor of using the sheet of molding material over components 1710.

A top and sidewalls of the module may be metalized by plating, sputtering, vapor deposition, or other technique to form shield 1740. Shield 1740 may be connected to one or more ground or other contacts 2924 on board or substrate 1720 in various ways. For example, the sidewalls may be soldered to one or more contacts 2924 on board 1720. The sidewalls may be soldered to contacts 2924 using a solder bead or ring 2910, or by using other technique. The solder bead or ring 2910, along with other contacts on the board, may be formed by screen printing or by dispensing a solder paste. The solder may wick up the side walls during reflow to improve the electrical connection between the module shield 1740 and board contact or contacts 2924. In various embodiments of the present invention, a portion 2942 of a bottom of the module near the outside edge may be at least partially metalized during the metallization of the top and sidewalls to improve the solder connection between board contacts and the sidewall of module. In various embodiments of the present invention, the bead or ring 2910 may be broken or have gaps at various intervals to relieve stress and either prevent cracks in the solder or otherwise limit their length.

This module may be formed in various ways. An example is shown above in FIGS. 18-21.

In various embodiments of the present invention, it may be desirable to isolate some components, such as components 1710, from other components in the module. This may be done using one or more posts or walls, such as posts or walls 122 above, or other posts or walls provided by embodiments of the present invention. These posts or walls, such as posts or walls 122 and the other posts or walls shown here may be formed of aluminum, steel, copper, or other conductive material. These posts or walls may be formed by stamping, forging, metallic injection molding (MIM), machining, micro-machining, or other manufacturing technique. In still other embodiments of the present invention, these posts or walls may be formed of a conductive adhesive. These conductive adhesive posts or walls may be formed using printing, stenciling, or other appropriate technique. These posts or walls may extend from a shield, such as shield 1740, to a contact, plating, or other conductive portion on a bottom side of the module.

In various embodiments of the present invention, other construction techniques may be employed to form the various system-in-a-package modules and other devices described above. For example, a technique referred to as Metal-Interconnect-Substrate (MIS) may be used. In MIS manufacturing, as with the above examples, one or more components, which may be electrical or electromagnet components such as passive components, such as capacitors and resistors, or active components, such as diodes, transistors, or integrated circuits such as a chip-scale package or flip-chip, may be attached to a top surface of a molded substrate having a number of first conductive paths. These components may be components such as components 210 in FIG. 2 or 1710 in FIG. 17 or the other components in the examples above. The molded substrate may be used in place of the printed circuit board 110 in FIG. 1 or the other printed circuit boards or substrates in the examples above. The one or more components may be attached to solder bumps or other structures on the substrate. These solder bumps may be the same or similar to solder bumps 2814 in FIG. 28 or the similar structures in the above examples. A second molded layer may be formed over the molded substrate. The second molded layer may include second conducive paths, which may each electrically connect to first conductive paths. The second layer may be ground to form a usable surface, onto which a redistribution layer connecting contacts of the one or more components to the paths in the first conductive paths. This redistribution layer may be the same or similar to redistribution layer 2518 in FIG. 25 or the other redistribution layers in the above examples. One or more further components can be attached to the top side of the redistribution layer. The resulting structure may be shielded with a cover, such as cover 820 shown in FIG. 8, or another cover such as the covers shown above. In other embodiments of the present invention, the top side of the redistribution layer and the one or more further components may be molded. The molded layer may then be plated to form a shield, such as shield 1740 as shown above in FIG. 17, or another of the shields shown above.

It should be noted that while the interconnect structures described above are well-suited to forming system-in-a-package modules, in other embodiments of the present invention, other types of electronic devices may be formed using these techniques.

In various embodiments of the present invention, contacts, interconnect paths, and other conductive portions of SIP modules may be formed by stamping, metal-injection molding, machining, micro-machining, 3-D printing, or other manufacturing process. The conductive portions may be formed of stainless steel, steel, copper, copper titanium, phosphor bronze, or other material or combination of materials. They may be plated or coated with nickel, gold, or other material. The nonconductive portions, such as the moldings, may be formed using injection or other molding, 3-D printing, machining, or other manufacturing process. The nonconductive portions may be formed of silicon or silicone, rubber, hard rubber, plastic, nylon, liquid-crystal polymers (LCPs), resin, or other nonconductive material or combination of materials. The printed circuit boards used may be formed of FR-4, BT or other material. Printed circuit boards may be replaced by other substrates, such as flexible circuit boards, in many embodiments of the present invention, while flexible circuit boards may be replaced by printed circuit boards in these and other embodiments of the present invention.

Embodiments of the present invention may provide SIP modules that may be located in various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An electronic device comprising:
    a substrate;
    a plurality of electrical components on a top side of the substrate; and
    a cover having a horizontal top portion supported by a vertical outside rim, where a bottom surface of the vertical outside rim is attached to a first pad on the top side of the substrate and the horizontal top portion is above the plurality of electrical components, wherein the cover comprises:
        a conductive stand-off separate from the cover, a bottom of the conductive stand-off attached to a second pad on the top side of the substrate;
        an insert molded portion adjacently located around a perimeter of a portion of the conductive stand-off to form the horizontal top portion; and
        a plated layer over a top of the conductive stand-off, a top of the horizontal top portion, and an outside surface of the vertical outside rim,
    wherein the cover forms a cavity over the top side of at least a portion of the substrate, the cavity defined by an inside surface of the of the vertical outside rim and a bottom of the horizontal top portion of the cover, wherein the bottom of the horizontal top portion of the cover comprises a recess, and wherein one of the plurality of electrical components fits in the recess.

2. The electronic device of claim 1 wherein the first pad on the top side of the substrate is electrically connected to a side plating extending from a top side of the substrate to a bottom side of the substrate on at least one side of the substrate.

3. The electronic device of claim 1 wherein the first pad on the top side of the substrate is electrically connected to a via extending from the top side to a bottom side of the substrate.

4. The electronic device of claim 1 wherein the insert molded portion is formed of plastic.

5. The electronic device of claim 1 wherein the insert molded portion is formed of liquid crystal polymer.

6. The electronic device of claim 1 wherein the plated layer is also formed on the bottom surface of the vertical outside rim.

7. The electronic device of claim 1 wherein an outside surface of the cover is plated.

8. The electronic device of claim 1 wherein the cover is formed of plastic having a plated outside surface.

9. The electronic device of claim 1 wherein the cover is formed of liquid crystal polymer having a plated outside surface, wherein a bottom surface of the vertical outside rim of the cover is also plated.

10. The electronic device of claim 1 wherein the cavity is at least partially filled with epoxy.

11. The electronic device of claim 1 wherein a second one of the plurality of electrical components does not fit in a recess in the cover.

12. The electronic device of claim 1 wherein the insert molded portion is absent over a top of the conductive stand-off.

13. The electronic device of claim 1 wherein the insert molded portion is adjacent to the conductive stand-off along a side of the conductive stand-off between a top of the conductive stand-off and the bottom of the conductive stand-off.

14. The electronic device of claim 6 wherein the plated layer on the bottom surface of the vertical outside rim is attached to the first pad on the top side of the substrate using anisotropic conductive film.

15. The electronic device of claim 6 wherein the plated layer on the bottom surface of the vertical outside rim is attached to the first pad on the top side of the substrate using anisotropic conductive paste.

16. The electronic device of claim 6 wherein the plated layer on the bottom surface of the vertical outside rim is attached to the first pad on the top side of the substrate using self-assembly anisotropic conductive paste.

17. The electronic device of claim 7 wherein a bottom surface of the vertical outside rim of the cover is also plated.

18. The electronic device of claim 9 wherein the first pad on the top side of the substrate is electrically connected to a side plating on at least one side of the substrate and the first pad is electrically connected to the plating on the bottom surface of the vertical outside rim of the cover.

19. The electronic device of claim 9 wherein the first pad on the top side of the substrate is electrically connected to a via extending from the top side to a bottom side of the substrate and the first pad is electrically connected to plating on the bottom surface of the vertical outside rim of the cover.

20. The electronic device of claim 11 wherein the cover is formed of plastic and an outside surface of the cover is plated.

* * * * *